(12) United States Patent
Warashina et al.

(10) Patent No.: US 11,287,320 B2
(45) Date of Patent: Mar. 29, 2022

(54) FILTER CONTROLLING EXPRESSION DERIVATION METHOD, LIGHT MEASUREMENT SYSTEM, CONTROL METHOD FOR FABRY-PEROT INTERFERENCE FILTER, AND FILTER CONTROL PROGRAM

(71) Applicant: HAMAMATSU PHOTONICS K.K., Hamamatsu (JP)

(72) Inventors: Yoshihisa Warashina, Hamamatsu (JP); Kei Tabata, Hamamatsu (JP)

(73) Assignee: HAMAMATSU PHOTONICS K.K., Hamamatsu (JP)

(*) Notice: Subject to any disclaimer, the term of this patent is extended or adjusted under 35 U.S.C. 154(b) by 20 days.

(21) Appl. No.: 16/615,151

(22) PCT Filed: May 14, 2018

(86) PCT No.: PCT/JP2018/018556
§ 371 (c)(1),
(2) Date: Nov. 20, 2019

(87) PCT Pub. No.: WO2018/216527
PCT Pub. Date: Nov. 29, 2018

(65) Prior Publication Data
US 2020/0173852 A1 Jun. 4, 2020

(30) Foreign Application Priority Data
May 23, 2017 (JP) .............................. JP2017-101741

(51) Int. Cl.
*G01J 3/26* (2006.01)
*G02B 5/28* (2006.01)
(Continued)

(52) U.S. Cl.
CPC . *G01J 3/26* (2013.01); *G01J 3/06* (2013.01); *G01J 3/28* (2013.01); *G02B 5/28* (2013.01);
(Continued)

(58) Field of Classification Search
CPC ........ G01J 3/26; G01J 3/06; G01J 3/28; G01J 2003/066; G02B 5/28; G02B 26/001;
(Continued)

(56) References Cited

U.S. PATENT DOCUMENTS 5,835,216 A * 11/1998 Koskinen ............. G01N 21/274
356/519
2004/0090141 A1 5/2004 Chi
(Continued)

FOREIGN PATENT DOCUMENTS

CN 105045292 A 11/2015
JP 2002-174721 A 6/2002
(Continued)

OTHER PUBLICATIONS

International Preliminary Report on Patentability dated Dec. 5, 2019 for PCT/JP2018/018556.

*Primary Examiner* — Kimberly N. Kakalec
(74) *Attorney, Agent, or Firm* — Faegre Drinker Riddle & Reath LLP

(57) ABSTRACT

Provided is a filter controlling expression derivation method including: preparing a Fabry-Perot interference filter of which distance between a fixed mirror and a movable mirror is controlled by balancing an electrostatic force and an elastic force; deriving a relational expression between a deflection amount and an elasticity index in which the elasticity index of the movable mirror is described as a quadratic or higher-order polynomial with the deflection amount of the movable mirror as a variable by performing predetermined measurement; and deriving a relational
(Continued)

expression between a transmission wavelength of light transmitted through the Fabry-Perot interference filter and the voltage as a filter controlling expression based on the relational expression between the deflection amount and the elasticity index and a relational expression between the electrostatic force and the elastic force.

6 Claims, 15 Drawing Sheets

(51) Int. Cl.
    *G02B 26/00*     (2006.01)
    *G01J 3/06*     (2006.01)
    *G01J 3/28*     (2006.01)
    *G02B 26/08*     (2006.01)
    *G02B 6/293*     (2006.01)

(52) U.S. Cl.
    CPC ......... *G02B 26/001* (2013.01); *G02B 26/085* (2013.01); *G01J 2003/066* (2013.01); *G02B 6/29358* (2013.01)

(58) Field of Classification Search
    CPC .. G02B 26/085; G02B 6/29358; G02B 26/00; B81B 3/00
    See application file for complete search history.

(56) References Cited

U.S. PATENT DOCUMENTS

2013/0114083 A1* 5/2013 Sano .................. G01J 3/10
    356/416
2015/0318799 A1 11/2015 Hirokubo

FOREIGN PATENT DOCUMENTS

| JP | 2012-113133 A | 6/2012 |
| JP | 2015-141210 A | 8/2015 |
| JP | 2015-523588 A | 8/2015 |
| JP | 2016-108499 A | 6/2016 |
| TW | 561131 B | 11/2003 |
| TW | I265313 B | 11/2006 |
| TW | I502176 B | 10/2015 |
| WO | WO-2013-165707 A2 | 11/2013 |

* cited by examiner (a)

(b)

(c)

FILTER CONTROLLING EXPRESSION DERIVATION METHOD, LIGHT MEASUREMENT SYSTEM, CONTROL METHOD FOR FABRY-PEROT INTERFERENCE FILTER, AND FILTER CONTROL PROGRAM

TECHNICAL FIELD

The present disclosure relates to a filter controlling expression derivation method, a light measurement system, a control method for a Fabry-Perot interference filter, and a filter control program.

BACKGROUND ART

For example, in Patent Literature 1, there is disclosed a Fabry-Perot interference filter having a fixed mirror portion and a movable mirror portion and changing a gap between the fixed mirror portion and the movable mirror portion by displacing the movable mirror portion with respect to the fixed mirror portion. In the Fabry-Perot interference filter, the transmission wavelength is controlled by changing the gap by controlling the voltage applied between the fixed mirror portion and the movable mirror portion.

CITATION LIST

Patent Literature

Patent Literature 1: Japanese Unexamined Patent Publication No. 2002-174721

SUMMARY OF INVENTION

Technical Problem

In the Fabry-Perot interference filter as described above, it is known that the relationship between the gap length between the mirrors and the applied voltage varies among individual objects even if the individual objects are manufactured by the same manufacturing apparatus. That is, even if a voltage is applied to generate a potential difference of the same magnitude between the mirrors, the transmission wavelengths are different among the individual objects. For this reason, it is necessary to acquire the relationship between the applied voltage and the transmission wavelength for each individual object. However, since the relationship between the applied voltage and the transmission wavelength is not generalized, in order to obtain this relationship with high accuracy, a long measurement time is required.

An object of an aspect of the present disclosure is to provide a filter controlling expression derivation method capable of suitably acquiring a relationship between an applied voltage and a transmission wavelength.

Solution to Problem

According to one aspect of the present disclosure, there is provided a filter controlling expression derivation method including: a preparation step of preparing a Fabry-Perot interference filter of which distance between a fixed mirror portion and a movable mirror portion is controlled by balancing an electrostatic force generated between the fixed mirror portion and the movable mirror portion and an elastic force generated in the movable mirror portion at a time of applying a voltage; a first derivation step of deriving a relational expression between a deflection amount of the movable mirror portion and an elasticity index of the movable mirror portion in which the elasticity index of the movable mirror portion is described as a quadratic or higher-order polynomial with the deflection amount of the movable mirror portion as a variable by performing predetermined measurement on the prepared Fabry-Perot interference filter under a predetermined environment temperature; and a second derivation step of deriving a relational expression between a transmission wavelength of light transmitted through the Fabry-Perot interference filter and the voltage as a filter controlling expression based on the relational expression between the deflection amount and the elasticity index and a relational expression between the electrostatic force and the elastic force, wherein, in the first derivation step, as the predetermined measurement, the transmission wavelength of light transmitted through the Fabry-Perot interference filter is measured in a state where each of a plurality of different voltages is applied as the voltage.

In the Fabry-Perot interference filter to which such a filter controlling expression derivation method is applied, the distance between the fixed mirror portion and the movable mirror portion is controlled by the balance between the electrostatic force and the elastic force, and thus, the transmission wavelength is variable by controlling the distance between the mirrors. The electrostatic force is determined according to the applied voltage, and the elastic force is determined according to the deflection amount and the elasticity index of the movable mirror portion. In addition, the deflection amount is a distance obtained by subtracting the distance between the mirrors in the state where the voltage is applied from the distance between the mirrors in the state where the voltage is not applied. That is, the distance between the mirrors can be determined based on the deflection amount. For this reason, the relational expression between the transmission wavelength of the light transmitted through the Fabry-Perot interference filter and the voltage can be derived based on the relational expression between the deflection amount and the elasticity index of the movable mirror portion and the relational expression between the electrostatic force and the elastic force. Herein, the inter-mirror distance and the deflection amount can be obtained based on the transmission wavelength, and the relational expression between the deflection amount and the elasticity index can be obtained by measuring the transmission wavelength in a state where each of a plurality of different voltages is applied. In the relational expression between the deflection amount and the elasticity index, since the elasticity index is described as a quadratic or higher-order polynomial with the deflection amount as a variable, it is possible to easily derive the elasticity index with high accuracy. This is a finding found by the present inventors. Therefore, it is possible to suitably acquire the relationship between the applied voltage and the transmission wavelength.

In addition, in one embodiment, the filter controlling expression derivation method may further include a third derivation step of deriving a correction term with the deflection amount and a change amount of environment temperature as variables by performing the predetermined measurement on another Fabry-Perot interference filter corresponding to the prepared Fabry-Perot interference filter under each of a plurality of environment temperatures including the predetermined environment temperature and being different from each other, wherein, in the second derivation step, the relational expression between the transmission wavelength and the voltage may be derived as the filter controlling expression so as to include the correction term. According to this configuration, since it is not necessary to derive the correction term in all the individual objects, it is possible to easily acquire the relationship between the transmission wavelength and the applied voltage according to the change of the environment temperature.

In one embodiment, in the first derivation step, a correction term with the deflection amount and a change amount of environment temperature as variables may be derived by performing the predetermined measurement on the prepared Fabry-Perot interference filter under each of a plurality of environment temperatures including the predetermined environment temperature and being different from each other, and, in the second derivation step, the relational expression between the transmission wavelength and the voltage may be derived as the filter controlling expression so as to include the correction term. According to this configuration, it is possible to acquire the relationship between the transmission wavelength and the applied voltage according to the change in the environment temperature with high accuracy.

According to one aspect of the present disclosure, there is provided a light measurement system including: a Fabry-Perot interference filter of which distance between a fixed mirror portion and a movable mirror portion is controlled by balancing an electrostatic force generated between the fixed mirror portion and the movable mirror portion and an elastic force generated in the movable mirror portion at a time of applying a voltage; and a control device which controls the voltage based on a relational expression between the electrostatic force and the elastic force including an elasticity index of the movable mirror portion described as a quadratic or higher-order polynomial with the deflection amount of the movable mirror portion as a variable.

In the light measurement system, the voltage is controlled to correspond to the transmission wavelength based on the relational expression between the electrostatic force and the elastic force. Herein, the electrostatic force is determined according to the voltages applied to the fixed mirror portion and the movable mirror portion, and the elastic force is determined according to the deflection amount and the elasticity index of the movable mirror portion. The elasticity index is described as a quadratic or higher-order polynomial with the deflection amount of the movable mirror portion as a variable, and the elasticity index varies according to the variation of the deflection amount. For this reason, it is possible to control the transmission wavelength of the light with high accuracy.

According to one aspect of the present disclosure, there is provided a control method for a Fabry-Perot interference filter being a control method for controlling a voltage in a Fabry-Perot interference filter of which distance between a fixed mirror portion and a movable mirror portion is controlled by balancing an electrostatic force generated between the fixed mirror portion and the movable mirror portion and an elastic force generated in the movable mirror portion at a time of applying the voltage, the control method including steps of: deriving a voltage corresponding to a transmission wavelength of light transmitted through the Fabry-Perot interference filter based on a relational expression between the electrostatic force and the elastic force including an elasticity index of the movable mirror portion described as a quadratic or higher-order polynomial with the deflection amount of the movable mirror portion as a variable; and setting the derived voltage as the voltage to be applied.

According to one aspect of the present disclosure, there is provided a filter control program for causing a computer to execute a process of controlling a voltage in a Fabry-Perot interference filter of which distance between a fixed mirror portion and a movable mirror portion is controlled by balancing an electrostatic force generated between the fixed mirror portion and the movable mirror portion and an elastic force generated in the movable mirror portion at a time of applying the voltage, the filter control program causing the computer to function as: a voltage derivation unit which derives a voltage corresponding to a transmission wavelength of light transmitted through the Fabry-Perot interference filter based on a relational expression between the electrostatic force and the elastic force including an elasticity index of the movable mirror portion described as a quadratic or higher-order polynomial with the deflection amount of the movable mirror portion as a variable; and a voltage setting unit which sets the derived voltage as the voltage to be applied.

According to one aspect of the present disclosure, there is provided a recording medium being a computer-readable recording medium for recording a filter control program.

Effects of Invention

According to one embodiment, it is possible to provide a filter controlling expression derivation method capable of easily acquiring a relationship between an applied voltage and a transmission wavelength.

DESCRIPTION OF EMBODIMENTS

Figure 1:
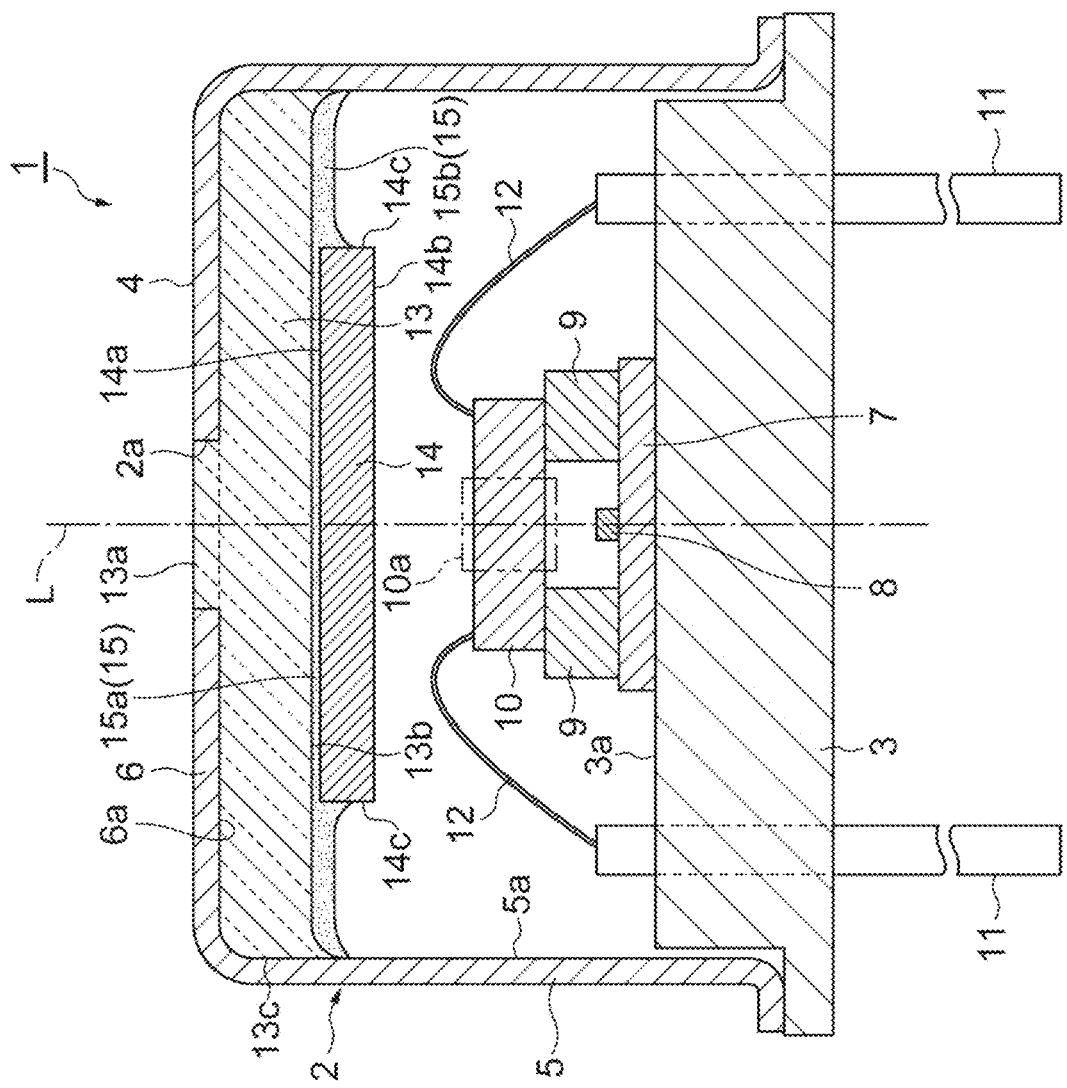
FIG. 1 is a cross-sectional view of a light detection device according to an embodiment.

Hereinafter, embodiments according to the present disclosure will be specifically described with reference to the drawings. For the convenience, in some cases, substantially the same elements may be denoted by the same reference numerals, and the description may be omitted.

First, an example of a light detection device provided with a Fabry-Perot interference filter will be described. As illustrated in FIG. 1, the light detection device 1 includes a package 2. The package 2 is a CAN package having a stem 3 and a cap 4. The cap 4 is integrally configured by a side wall 5 and a top wall 6. The stem 3 and the cap 4 are made of a metal material and are airtightly bonded to each other. In the package 2 made of a metal material, the shape of the side wall 5 is cylindrical with a predetermined line L as a center line. The stem 3 and the top wall 6 face each other in the direction parallel to the line L, and close the both ends of the side wall 5, respectively.

A wiring substrate 7 is fixed to an inner surface 3a of the stem 3. As a substrate material of the wiring substrate 7, for example, silicon, ceramic, quartz, glass, plastic, or the like can be used. A light detector (light detection unit) 8 and a temperature detector 16 (refer to FIG. 4) such as a thermistor are mounted on the wiring substrate 7. The light detector 8 is disposed on the line L. More specifically, the light detector 8 is disposed such that the center line of the light reception portion coincides with the line L. The light detector 8 is, for example, an infrared detector such as a quantum sensor using InGaAs or the like, a thermal sensor using a thermopile or a bolometer, or the like. In the case of detecting light in each wavelength range of ultraviolet, visible, and near infrared, for example, a silicon photodiode can be used as the light detector 8. In addition, the light detector 8 may be provided with one light reception portion or may be provided with a plurality of light reception portions in an array shape. Furthermore, a plurality of light detectors 8 may be mounted on the wiring substrate 7. The temperature detector 16 may be disposed, for example, at a position close to the Fabry-Perot interference filter 10 such that the change in temperature of the Fabry-Perot interference filter 10 can be detected.

A plurality of spacers 9 are fixed on the wiring substrate 7. As a material of each spacer 9, for example, silicon, ceramic, quartz, glass, plastic, or the like can be used. The Fabry-Perot interference filter 10 is fixed on the plurality of spacers 9 by, for example, an adhesive. The Fabry-Perot interference filter 10 is disposed on the line L. More specifically, the Fabry-Perot interference filter 10 is disposed such that the center line of a light transmission region 10a coincides with the line L. In addition, the spacer 9 may be configured integrally with the wiring substrate 7. In addition, the Fabry-Perot interference filter 10 may be supported not by the plurality of spacers 9 but by one spacer 9.

A plurality of lead pins 11 are fixed to the stem 3. More specifically, each lead pin 11 passes through the stem 3 in a state where electrical insulation and airtightness with the stem 3 are maintained. Each lead pin 11 is electrically connected by a wire 12 to an electrode pad provided on the wiring substrate 7, a terminal of the light detector 8, a terminal of the temperature detector 16, and a terminal of the Fabry-Perot interference filter 10. The light detector 8, the temperature detector 16, and the Fabry-Perot interference filter 10 may be electrically connected to the lead pins 11 through the wiring substrate 7. For example, each terminal may be electrically connected to an electrode pad provided on the wiring substrate 7, and the electrode pad may be connected to each lead pin 11 by the wire 12. This enables input and output of electric signals to and from each of the light detector 8, the temperature detector 16, and the Fabry-Perot interference filter 10.

An opening 2a is formed in the package 2. More specifically, the opening 2a is formed in the top wall 6 of the cap 4 such that the center line of the opening coincides with the line L. When viewed from the direction parallel to the line L, the shape of the opening 2a is circular. A light transmitting member 13 is disposed on an inner surface 6a of the top wall 6 so as to close the opening 2a. The light transmitting member 13 is airtightly bonded to the inner surface 6a of the top wall 6. The light transmitting member 13 has a light incident surface 13a and a light emitting surface (inner surface) 13b facing each other in the direction parallel to the line L and a side surface 13c. The light incident surface 13a of the light transmitting member 13 is substantially flush with the outer surface of the top wall 6 at the opening 2a. The side surface 13c of the light transmitting member 13 is in contact with an inner surface 5a of the side wall 5 of the package 2. That is, the light transmitting member 13 reaches the inside of the opening 2a and the inner surface 5a of the side wall 5. Such a light transmitting member 13 is formed by disposing a glass pellet inside the cap 4 with the opening 2a facing downward and melting the glass pellet. That is, the light transmitting member 13 is made of a fusion glass.

A band pass filter 14 is fixed to the light emitting surface 13b of the light transmitting member 13 by an adhesive member 15. That is, the adhesive member 15 fixes the band pass filter 14 to the inner surface 6a of the top wall 6 through the light transmitting member 13 bonded to the inner surface 6a of the top wall 6. Among the light transmitted through the light transmitting member 13, the band pass filter 14 selectively transmits light (light in a predetermined wavelength range and is incident on the light transmission region 10a of the Fabry-Perot interference filter 10) of a measurement wavelength range of the light detection device 1 (that is, transmits only light in the wavelength range). The band pass filter 14 has a rectangular plate shape. More specifically, the band pass filter 14 has a light incident surface 14a and a light emitting surface 14b facing each other in the direction parallel to the line L and four side surfaces 14c. The band pass filter 14 is configured by forming a dielectric multilayer film (a multilayer film formed by combining, for example, a high refractive material such as TiO2 or Ta2O5 and a low refractive material such as SiO2 or MgF2) on the surface of a light transmitting member formed in a rectangular plate shape by a light transmitting material (for example, silicon, glass, or the like).

The adhesive member 15 has a first portion 15a disposed in the entire area of the light incident surface 14a of the band pass filter 14. That is, the first portion 15a is a portion of the adhesive member 15 disposed between the light emitting surface 13b of the light transmitting member 13 and the light incident surface 14a of the band pass filter 14 facing each other. Furthermore, the adhesive member 15 has a second portion 15b that protrudes outward from the outer edge of the band pass filter 14 when viewed in the direction parallel to the line L. The second portion 15b extends to the inner surface 5a of the side wall 5 and is in contact with the inner surface 5a of the side wall 5. The second portion 15b is in contact with the side surface 14c of the band pass filter 14.

In the light detection device 1 configured as described above, when light is incident on the band pass filter 14 from the outside through the opening 2a, the light transmitting member 13, and the adhesive member 15, light in a predetermined wavelength range is selectively transmitted. When the light transmitted through the band pass filter 14 is incident on the light transmission region 10a of the Fabry-Perot interference filter 10, the light of having the predetermined wavelength among the light in the predetermined wavelength range is selectively transmitted. The light transmitted through the light transmission region 10a of the Fabry-Perot interference filter 10 is incident on the light reception portion of the light detector 8 and is detected by the light detector 8. That is, the light detector 8 converts the light transmitted through the Fabry-Perot interference filter 10 into an electric signal and outputs the electric signal.

Figure 2:
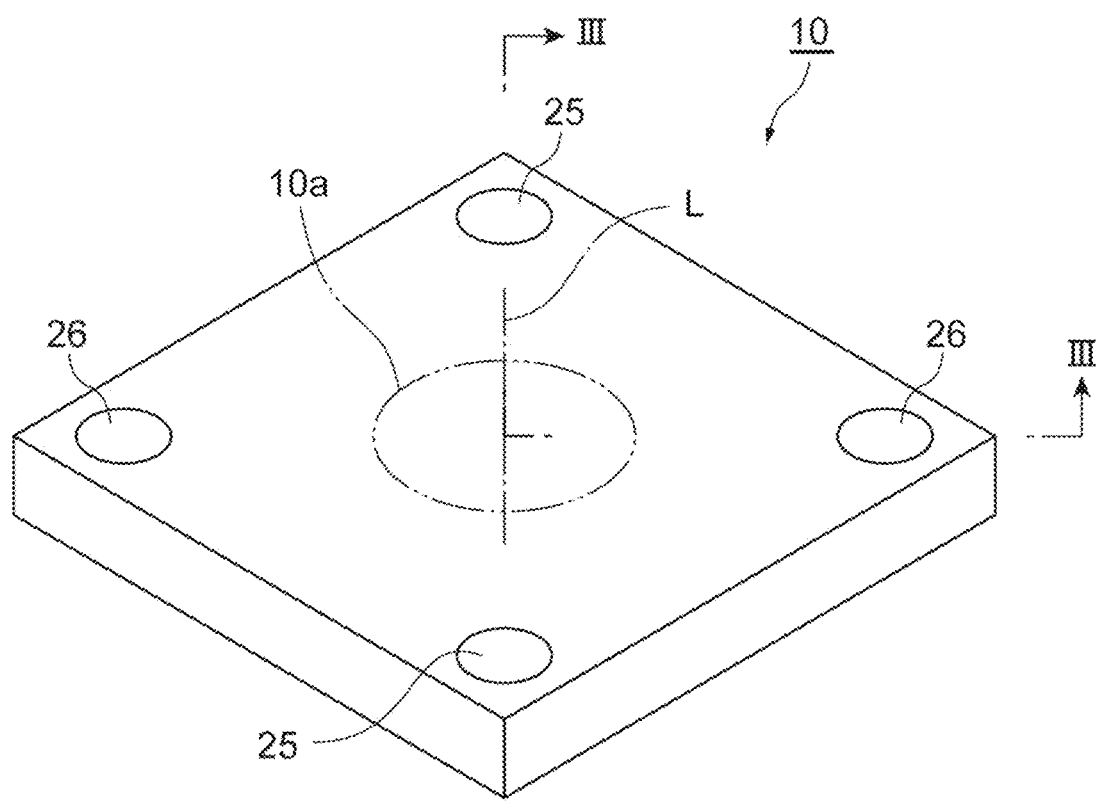
FIG. 2 is a perspective view of a Fabry-Perot interference filter.
Figure 3:
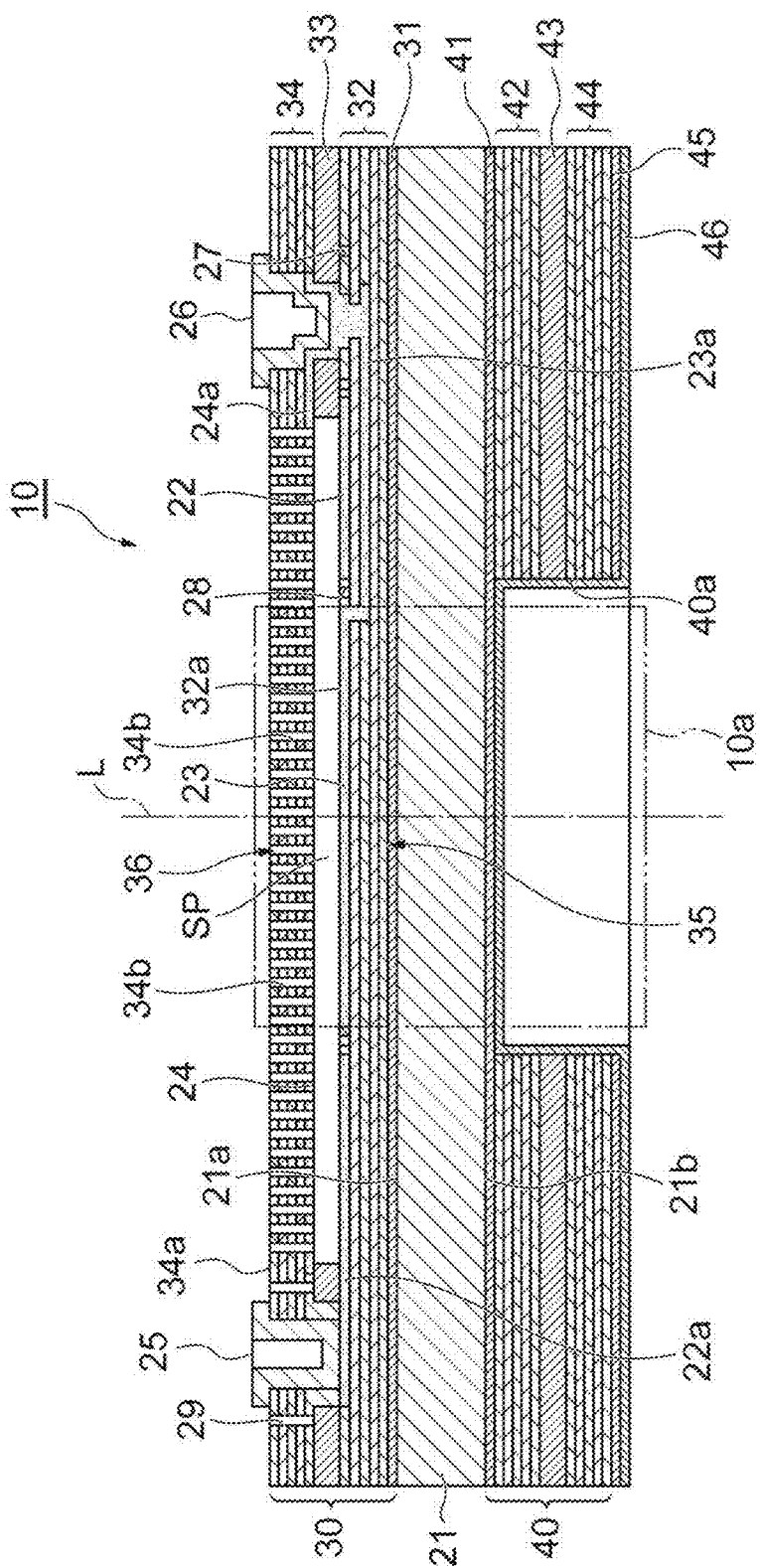
FIG. 3 is a cross-sectional view taken along line III-III of FIG. 2

As illustrated in FIGS. 2 and 3, in the Fabry-Perot interference filter 10, the light transmission region 10a for transmitting light according to the distance between a first mirror portion (fixed mirror portion) 35 and a second mirror portion (movable mirror portion) 36 (that is, between the pair of mirror portions) is provided on the line L. The light transmission region 10a is, for example, a cylindrical region. In the light transmission region 10a, the distance between the first mirror portion 35 and the second mirror portion 36 is controlled with very high accuracy. That is, the light transmission region 10a is a region where the distance between the first mirror portion 35 and the second mirror portion 36 can be controlled to a predetermined distance in order to selectively transmit light having a predetermined wavelength in the Fabry-Perot interference filter 10 and a region which can transmit the light having a predetermined wavelength according to the distance of the first mirror portion 35 and the second mirror portion 36.

The Fabry-Perot interference filter 10 includes a rectangular plate-shaped substrate 21. The substrate 21 has a first surface 21a and a second surface 21b facing each other in the direction parallel to the line L. The first surface 21a is a surface on the light incident side. The second surface 21b is a surface on the side (that is, the light emitting side) closer to the light detector 8. A first layer structure body 30 is disposed on the first surface 21a. A second layer structure body 40 is disposed on the second surface 21b.

The first layer structure body 30 is configured by stacking a first antireflection layer 31, a first stacked body 32, a first intermediate layer 33, and a second stacked body 34 in this order on the first surface 21a. A gap S is formed between the first stacked body 32 and the second stacked body 34 by the frame-like first intermediate layer 33. The substrate 21 is made of, for example, silicon, quartz, glass or the like. In a case where the substrate 21 is made of silicon, the first antireflection layer 31 and the first intermediate layer 33 are made of, for example, silicon oxide. The thickness of the first intermediate layer 33 is, for example, several tens nm to several tens μm.

A portion of the first stacked body 32 corresponding to the light transmission region 10a functions as the first mirror portion 35. The first stacked body 32 is configured by alternately stacking a plurality of polysilicon layers and a plurality of silicon nitride layers one by one. The optical thickness of each of the polysilicon layer and the silicon nitride layer constituting the first mirror portion 35 is preferably an integral multiple of ¼ of the central transmission wavelength. In addition, the first mirror portion 35 may be disposed directly on the first surface 21a without the first antireflection layer 31.

A portion of the second stacked body 34 corresponding to the light transmission region 10a functions as the second mirror portion 36. The second mirror portion 36 faces the first mirror portion 35 via the gap SP in the direction parallel to the line L. The second stacked body 34 is configured by alternately stacking a plurality of polysilicon layers and a plurality of silicon nitride layers one by one. The optical thickness of each of the polysilicon layer and the silicon nitride layer constituting the second mirror portion 36 is preferably an integral multiple of ¼ of the central transmission wavelength.

In the first stacked body 32 and the second stacked body 34, a silicon oxide layer may be disposed instead of the silicon nitride layer. In addition to the materials described above, a titanium oxide, a tantalum oxide, a zirconium oxide, a magnesium fluoride, an aluminum oxide, a calcium fluoride, silicon, germanium, a zinc sulfide, and the like may be used as the material of each layer constituting the first stacked body 32 and the second stacked body 34.

A plurality of through holes 34b extending from a surface 34a on the side of the second stacked body 34 opposite to the first intermediate layer 33 to the gap SP are formed in a portion of the second stacked body 34 corresponding to the gap SP. The plurality of through holes 34b are formed to such an extent that the plurality of though holes 34b do not substantially affect the function of the second mirror portion 36. The plurality of through holes 34b are used to form the gap SP by removing a portion of the first intermediate layer 33 by etching.

In the first mirror portion 35, a first electrode 22 is formed so as to surround the light transmission region 10a. In the first mirror portion 35, a second electrode 23 is formed so as to include the light transmission region 10a. That is, the first mirror portion 35 includes the first electrode 22 and the second electrode 23. The first electrode 22 and the second electrode 23 are formed by doping the polysilicon layer closest to the gap SP in the first stacked body 32 with impurities to reduce the resistance. A third electrode 24 is formed in the second mirror portion 36. That is, the second mirror portion 36 includes the third electrode 24. The third electrode 24 faces the first electrode 22 and the second electrode 23 via the gap SP in the direction parallel to the line L. The third electrode 24 is formed by doping the polysilicon layer closest to the gap SP in the second stacked body 34 with impurities to reduce the resistance. The size of the second electrode 23 is preferably a size including the entire light transmission region 10a, but may be substantially the same as the size of the light transmission region 10a.

The first layer structure body 30 is provided with a pair of first terminals 25 and a pair of second terminals 26. The pair of first terminals 25 face each other with the light transmission region 10a interposed therebetween. Each first terminal 25 is disposed in the through hole extending from the surface 34a of the second stacked body 34 to the first stacked body 32. Each first terminal 25 is electrically connected to the first electrode 22 through a wiring 22a. The pair of second terminals 26 face each other with the light transmission region 10a interposed therebetween in a direction perpendicular to the direction in which the pair of first terminals 25 face each other. Each second terminal 26 is disposed in the through hole extending from the surface 34a of the second stacked body 34 to the inside of the first intermediate layer 33. Each second terminal 26 is electrically connected to the second electrode 23 through a wiring 23a and electrically connected to the third electrode 24 through a wiring 24a.

Trenches 27 and 28 are provided on a surface 32a on the side of the first stacked body 32 closer to the first intermediate layer 33. The trench 27 extends in an annular shape so as to surround a connection portion of the wiring 23a with the second terminal 26. The trench 27 electrically insulates the first electrode 22 and the wiring 23a. The trench 28 extends in an annular shape along the inner edge of the first electrode 22. The trench 28 electrically insulates the first electrode 22 and the region (that is, the region where the second electrode 23 exists) inside the first electrode 22. A trench 29 is provided on the surface 34a of the second stacked body 34. The trench 29 extends in an annular shape so as to surround the first terminal 25. The trench 29 electrically insulates the first terminal 25 and the third electrode 24. The inner region of each of the trenches 27, 28, and 29 may be an insulating material or a gap.

The second layer structure body 40 is configured by stacking a second antireflection layer 41, a third stacked body 42, a second intermediate layer 43, and a fourth stacked body 44 in this order on the second surface 21b. The second antireflection layer 41, the third stacked body 42, the second intermediate layer 43, and the fourth stacked body 44 have the same configurations as the first antireflection layer 31, the first stacked body 32, the first intermediate layer 33, and the second stacked body 34, respectively. Thus, the second layer structure body 40 has a stacked structure symmetrical to the first layer structure body 30 with respect to the substrate 21. That is, the second layer structure body 40 is configured so as to correspond to the first layer structure body 30. The second layer structure body 40 has a function of suppressing warpage or the like of the substrate 21.

An opening 40a is formed in the third stacked body 42, the second intermediate layer 43, and the fourth stacked body 44 so as to include the light transmission region 10a. The center line of the opening 40a coincides with the line L. The opening 40a is, for example, a cylindrical region and has a diameter substantially the same as that of the light transmission region 10a. The opening 40a is opened on the light emitting side, and the bottom surface of the opening 40a reaches the second antireflection layer 41. The opening 40a passes light transmitted through the first mirror portion 35 and the second mirror portion 36.

A light shielding layer 45 is formed on the surface on the light emitting side of the fourth stacked body 44. The light shielding layer 45 is made of, for example, aluminum or the like. A protective layer 46 is formed on the surface of the light shielding layer 45 and the inner surface of the opening 40a. The protective layer 46 is made of, for example, an aluminum oxide. The optical influence of the protective layer 46 can be ignored by setting the thickness of the protective layer 46 to be in a range of 1 to 100 nm (preferably, about 30 nm).

The Fabry-Perot interference filter 10 configured as described above has a pair of the first mirror portion 35 and the second mirror portion 36 facing each other via the gap SP, and the distance between the pair of the first mirror portion 35 and the second mirror portion 36 is changed according to the potential difference generated between the pair of the first mirror portion 35 and the second mirror portion 36. That is, in the Fabry-Perot interference filter 10, a voltage is applied between the first electrode 22 and the third electrode 24 through the pair of first terminals 25 and the pair of second terminals 26. Accordingly, a potential difference is generated between the first electrode 22 and the third electrode 24 by the voltage, and thus, an electrostatic force corresponding to the potential difference is generated between the first electrode 22 and the third electrode 24. The second mirror portion 36 is attracted to the first mirror portion 35 side fixed to the substrate 21 by the electrostatic force, and thus, the distance between the first mirror portion 35 and the second mirror portion 36 is adjusted. In addition, in the Fabry-Perot interference filter 10 having such a configuration, the region surrounding the light transmission region 10a in the second stacked body 34 having the second mirror portion 36 is mainly deformed (inclined), so that the second mirror portion 36 corresponding to the light transmission region 10a is attracted to the first mirror portion 35 side while maintaining the flatness. That is, a portion of the second stacked body 34 having the second mirror portion 36 is deformed, so that the second mirror portion 36 is attracted to the first mirror portion 35 side. Thus, in the Fabry-Perot interference filter 10, the distance between the first mirror portion 35 and the second mirror portion 36 is variable.

The wavelength (peak transmission wavelength) of light transmitted through the Fabry-Perot interference filter 10 depends on the distance (inter-mirror distance) between the first mirror portion 35 and the second mirror portion 36 in the light transmission region 10a. Therefore, by adjusting the voltage applied between the first electrode 22 and the third electrode 24, the wavelength of light to be transmitted can be appropriately selected. As the potential difference between the first electrode 22 and the third electrode 24 increases, the distance between the first mirror portion 35 and the second mirror portion 36 is decreased, and thus, the wavelength of light transmitted through the Fabry-Perot interference filter 10 is reduced. The second electrode 23 has the same potential as the third electrode 24. Therefore, the second electrode 23 functions as a compensation electrode for maintaining the first mirror portion 35 and the second mirror portion 36 to be flat in the light transmission region 10a.

In the light detection device 1, for example, while changing the voltage applied to the Fabry-Perot interference filter 10 (that is, while changing the distance between the first mirror portion 35 and the second mirror portion 36 in the Fabry-Perot interference filter 10), it is possible to obtain a spectroscopic spectrum by detecting the intensity of light transmitted through the light transmission region 10a of the Fabry-Perot interference filter 10 by the light detector 8.

Figure 4:
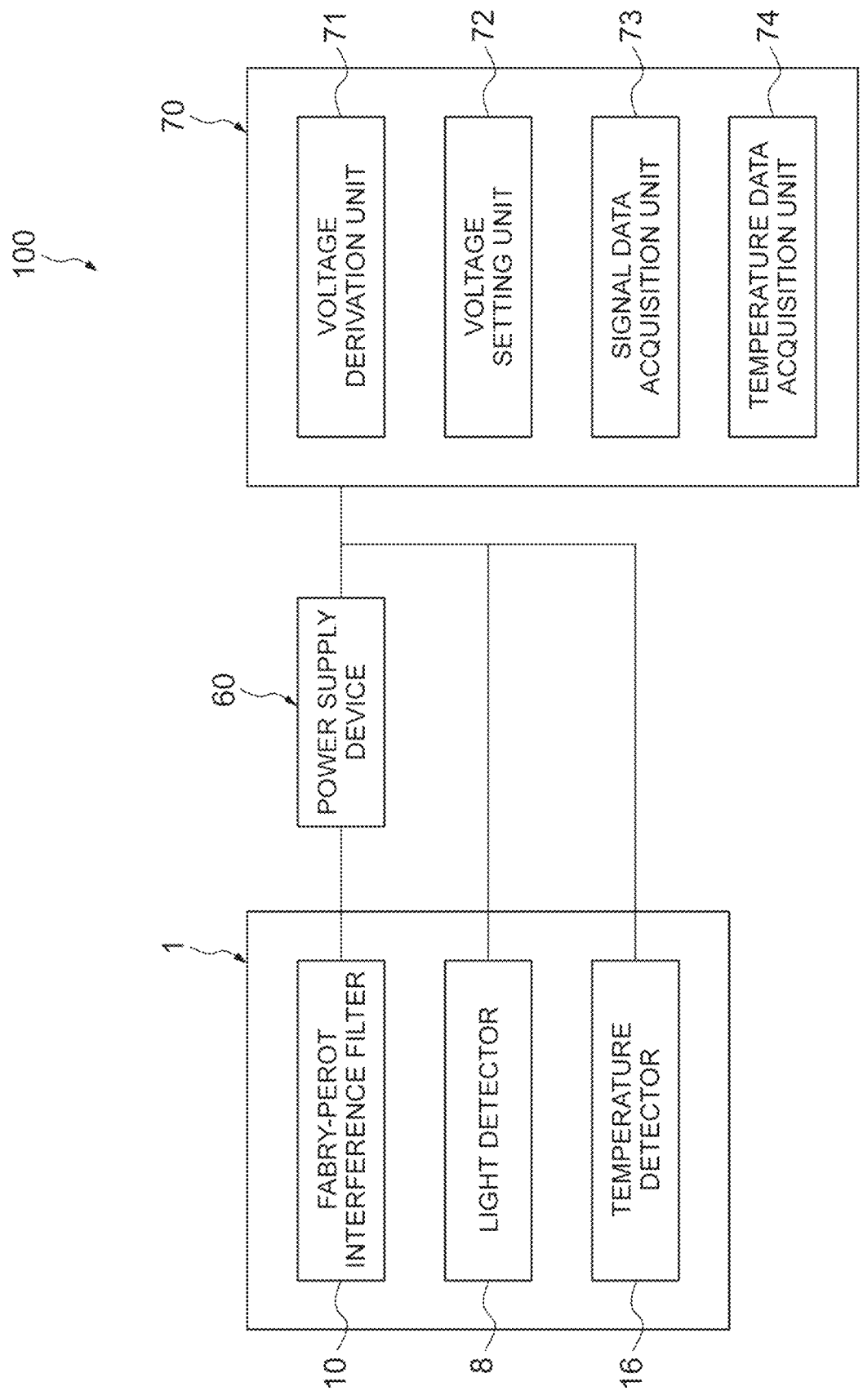
FIG. 4 is a block diagram illustrating a light measurement system.

Subsequently, the light measurement system will be described with reference to FIG. 4. As illustrated in FIG. 4, a light measurement system 100 includes the light detection device 1, a power supply device 60, and a control device 70. As described above, the light detection device 1 includes the Fabry-Perot interference filter 10, the light detector 8, and the temperature detector 16. The power supply device 60 can apply a voltage to the pair of the first mirror portion 35 and second mirror portion 36 constituting the Fabry-Perot interference filter 10. More specifically, the power supply device 60 is electrically connected to the lead pin 11 and generates a potential difference by applying a voltage between the first electrode 22 and the third electrode 24 through the pair of first terminals 25 and the pair of second terminals 26.

The control device 70 includes a voltage derivation unit 71, a voltage setting unit 72, a signal data acquisition unit 73, and a temperature data acquisition unit 74. The control device 70 can be configured with a computer including an arithmetic circuit such as a CPU on which arithmetic processing is performed, a recording medium configured with a memory such as a RAM and a ROM, and an input/output device. For example, the control device 70 may be configured by a computer such as a smart device including a smartphone, a tablet terminal, and the like. The control device 70 is electrically connected to the power supply device 60. In addition, the control device 70 is electrically connected to the light detector 8 and the temperature detector 16 of the light detection device 1. The control method for the Fabry-Perot interference filter executed in the control device 70 can be executed on the basis of a program stored in the recording medium.

The voltage derivation unit 71 derives information of the voltage applied to the Fabry-Perot interference filter 10 on the basis of, for example, the conditions set by the user. For example, the voltage derivation unit 71 derives the magnitude of the voltage to be applied, the timing of the application, and the duration time of the application. The voltage setting unit 72 generates a control signal according to the information of the voltage derived by the voltage derivation unit 71. The voltage setting unit 72 outputs the control signal to the power supply device 60 and controls the voltage applied from the power supply device 60 to the Fabry-Perot interference filter 10. In addition, the voltage applied to the Fabry-Perot interference filter 10 is a voltage applied between the first electrode 22 and the third electrode 24.

The signal data acquisition unit 73 acquires the electric signal converted by the light detector 8. For example, the signal data acquisition unit 73 may retain the voltage applied to the Fabry-Perot interference filter 10 and the electric signal acquired in the state where the voltage is applied in association with each other on the basis of the control signal output from the voltage setting unit 72 to the power supply device 60 and the acquired electric signal from the light detector 8.

The temperature data acquisition unit 74 acquires the temperature of the Fabry-Perot interference filter 10. In the present embodiment, the temperature data acquisition unit 74 acquires the temperature of the Fabry-Perot interference filter 10 on the basis of the input value from the temperature detector 16 in the light detection device 1. For example, in a case where the temperature detector 16 is a thermistor, the temperature data acquisition unit 74 acquires the electric resistance value of the thermistor and derives the temperature from the electric resistance value.

The voltage derivation unit 71 derives a voltage according to the wavelength of the light to be measured such that the wavelength of the light transmitted through the Fabry-Perot interference filter 10 becomes the wavelength of the light to be measured. In the present embodiment, the voltage derivation unit 71 derives a voltage on the basis of a filter controlling expression representing a relational expression between the peak transmission wavelength and the voltage.

Subsequently, the filter controlling expression representing the relational expression between the peak transmission wavelength of the light transmitted through the Fabry-Perot interference filter and the voltage will be described. The filter controlling expression is an expression for obtaining the voltage V applied to the mirror portion from the value of the target peak transmission wavelength λ. Herein, when applying the voltage V to the mirror portion, the potential of the first electrode 22 may be fixed at 0 V, and the voltage V may be applied to the second electrode 23 and the third electrode 24. Accordingly, the applied voltage V corresponds to the potential difference between the first electrode 22 and the third electrode 24. The filter controlling expression in the present embodiment has a reference temperature parameter, a first temperature correction term (correction term), and a second temperature correction term (correction term). The reference temperature parameter is a parameter when the Fabry-Perot interference filter 10 is used at a reference environment temperature. The first temperature correction term and the second temperature correction term are parameters for correcting the reference temperature parameter in a case where the Fabry-Perot interference filter 10 is used at an environment temperature different from the reference environment temperature.

For the Fabry-Perot interference filter 10, a filter controlling expression represented as a general expression will be described. First, the filter controlling expression including only the reference temperature parameter will be described.

Figure 5:
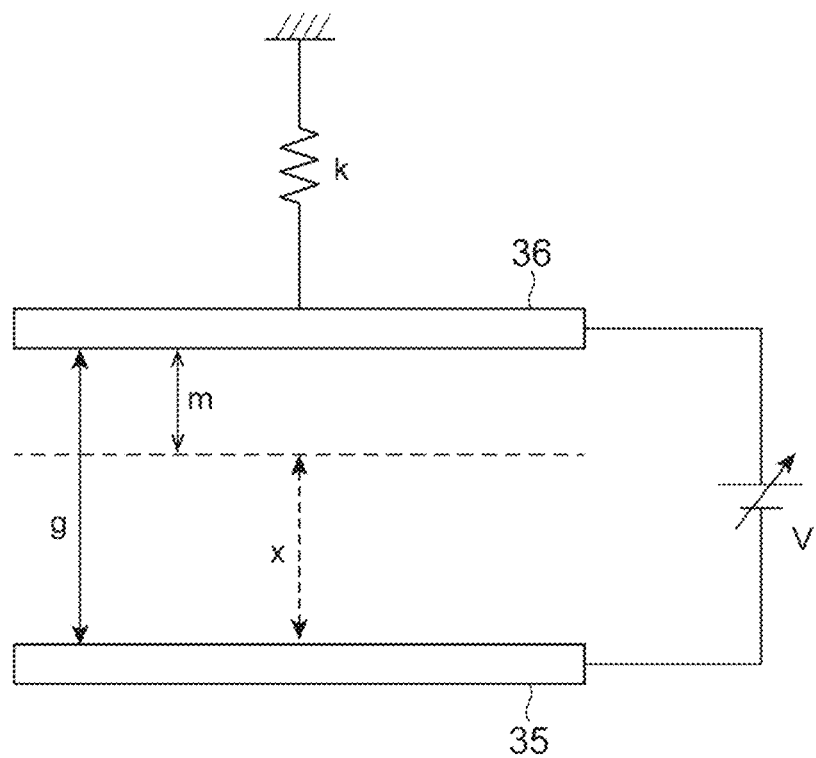
FIG. 5 is a schematic view illustrating operations of a Fabry-Perot interference filter.

FIG. 5 is a schematic view illustrating operations of the Fabry-Perot interference filter. As illustrated in FIG. 5, in the Fabry-Perot interference filter 10, a potential difference is generated between the first mirror portion 35 and the second mirror portion 36, so that an electrostatic force is generated between the first mirror portion 35 and the second mirror portion 36 (hereinafter, referred to as "between mirrors"). Due to this electrostatic force, the deflection occurs in the second mirror portion 36 so as to reduce the distance between the mirrors. In FIG. 5, the deflection resistance of the second mirror portion 36 is represented with a virtual spring provided on the second mirror portion 36. In such a Fabry-Perot interference filter 10, the distance between the first mirror portion 35 and the second mirror portion 36 is controlled by balancing the elastic force generated by the deflection of the second mirror portion 36 and the electrostatic force. That is, in a case where an initial gap is denoted by g, the inter-mirror distance is denoted by x, the mirror area is denoted by S, the dielectric constant of the medium between the mirrors is denoted by ε, the refractive index of the medium between the mirrors is denoted by n, the applied voltage is denoted by V, and the deflection amount of the second mirror portion 36 is denoted by m, if the spring constant of the virtual spring is denoted by k, the balance expression (relational expression) between the electrostatic force and the elastic force is represented by the following Formula (1). Formula (1) can be converted into Formula (2).

[Math. 1]

$$km = \frac{\varepsilon S}{2x^2} V^2 \tag{1}$$

[Math. 2]

$$\frac{V^2}{x^2} = \frac{2}{\varepsilon S} km = Ckm = k'm \tag{2}$$

In Formula (2), 2/(εS) is denoted by a coefficient C, and a product of the coefficient C and the spring constant k is set as an elasticity index k', so that the balance expression is represented as a relational expression between $V^2/x^2$ and the deflection amount m. Similarly to the spring constant k, the elasticity index k' can be an index indicating the deflection resistance of the second mirror portion 36.

In a case where it is assumed that the first mirror portion 35 and the second mirror portion 36 have no wavelength dependency in principle of the Fabry-Perot interference filter 10, the value of the inter-mirror distance x directly becomes the value of the peak transmission wavelength λ. However, in the actual Fabry-Perot interference filter 10, since the mirror is formed with a stacked body (multilayer film), the reflectance depends on the wavelength, and furthermore, a deviation in thickness and the like from the design values at the time of forming each layer constituting the multilayer film exist as variations, and the behaviors with respect to the wavelength are different among the individual objects. As described above, since the Fabry-Perot interference filter 10 has wavelength dependency, a conversion expression for converting the inter-mirror distance x into the peak transmission wavelength λ is required.

Figure 6:
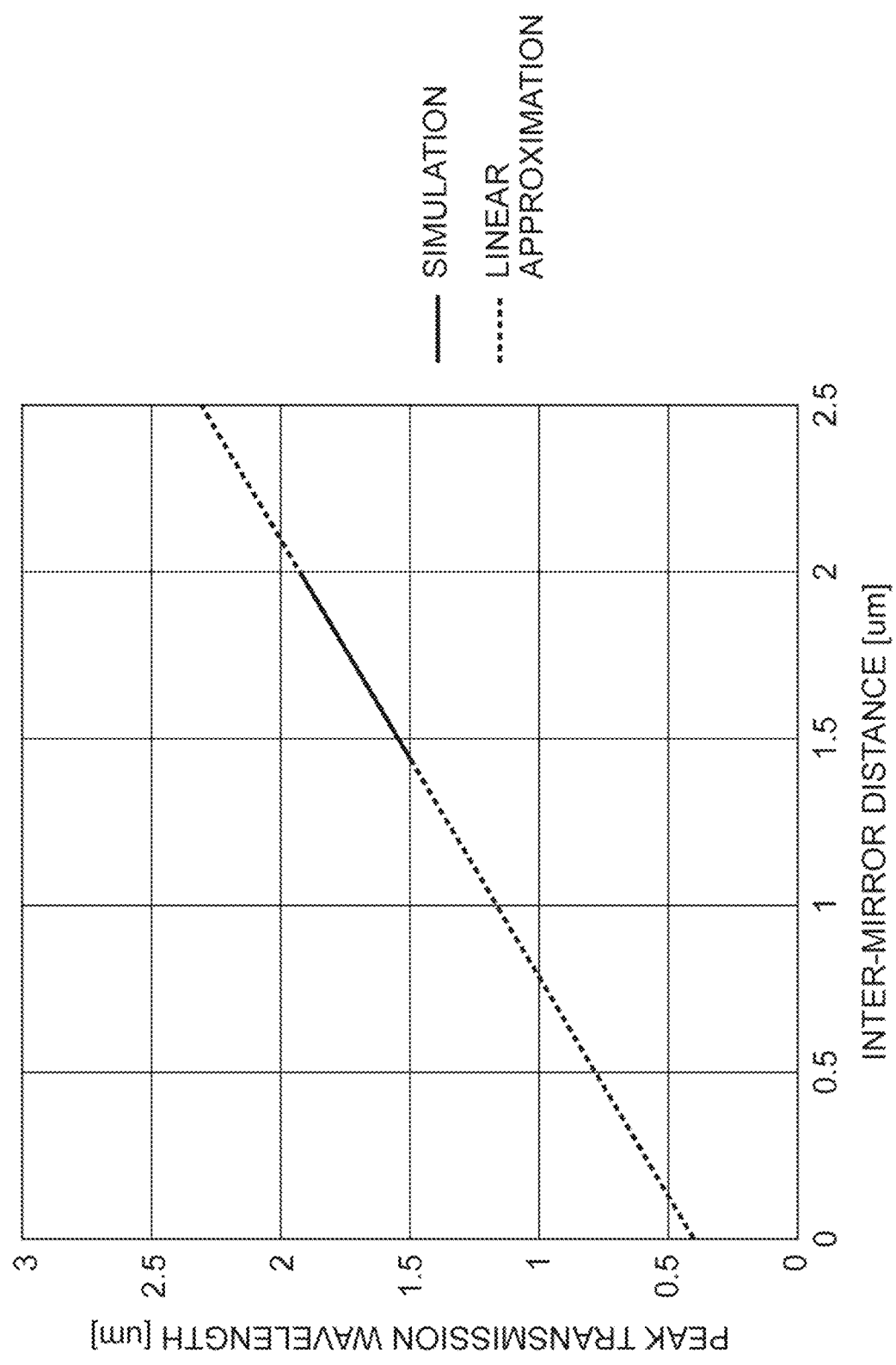
FIG. 6 illustrates results obtained by simulating a relationship between an inter-mirror distance and a transmission wavelength.

FIG. 6 illustrates results obtained by simulating the relationship between the inter-mirror distance x and the peak transmission wavelength λ. FIG. 6 illustrates linear approximation of the simulation result together with the simulation result. As illustrated in FIG. 6, since the relationship between the inter-mirror distance x and the peak transmission wavelength λ is linear, a linear expression representing the relationship between the inter-mirror distance x and the peak transmission wavelength λ can be derived. In the present embodiment, the conversion of the inter-mirror distance x and the peak transmission wavelength λ can be performed on the basis of the linear expression representing the relationship between the inter-mirror distance x and the peak transmission wavelength λ.

Figure 7:
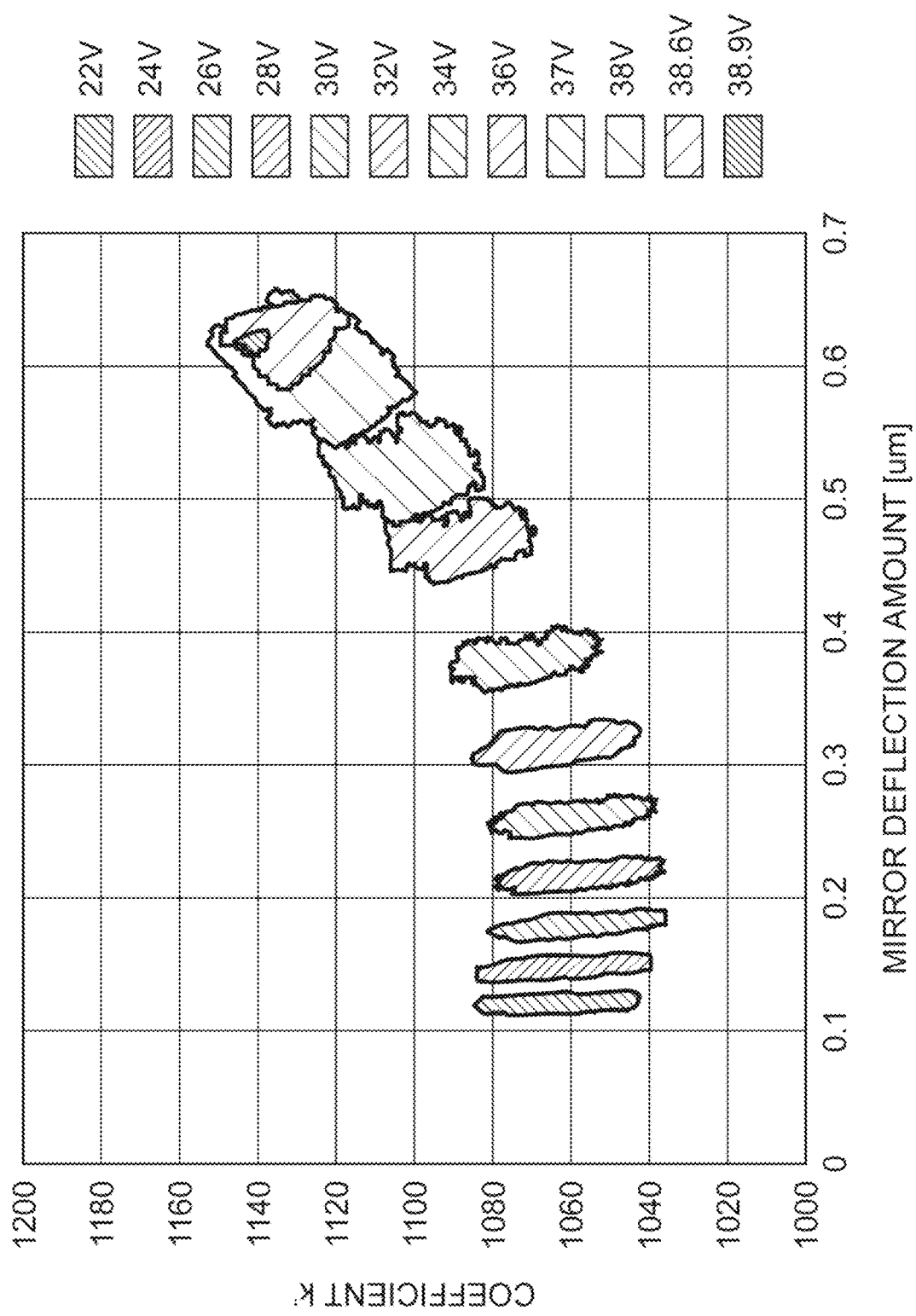
FIG. 7 is a graph in which a relationship between a deflection amount and an elasticity index is plotted.

FIG. 7 is a graph in which the relationship between the deflection amount m and the elasticity index k' is plotted on the basis of actual measurement data for about 2000 light detection devices. That is, FIG. 7 is a graph in which the deflection amounts m and the elasticity indexes k' obtained on the basis of the peak transmission wavelength λ measured while changing the applied voltage (for example, 22 V, 24 V, 26 V, 28 V, 30 V, 32 V, 34 V, 36 V, 37 V, 38 V, 38.6 V, and 38.9 V) under a constant environment temperature (for example, 25° C.) are plotted for each light detection device. The inter-mirror distance x is derived from the measured peak transmission wavelength λ on the basis of the relationship between the inter-mirror distance x and the peak transmission wavelength λ obtained from FIG. 6 described above. Since the deflection amount m of the mirror is a value obtained by subtracting the inter-mirror distance x from the initial gap g, the deflection amount m of the mirror can be derived by m=g−x. The initial gap g is derived, for example, from the peak transmission wavelength λ measured in a case where no voltage is applied between the mirrors.

As shown in FIG. 7, the relationship between the elasticity index k' and the deflection amount m of the mirror represents a distribution that can be approximated to a quadratic polynomial. Therefore, the elasticity index k' can be represented by the following Formula (3) (a relational expression between the deflection amount and the elasticity index) which is a function having the deflection amount m as a variable.

[Math. 3]

$$k'=am^2+bm+c \quad (3)$$

As described above, k'=Ck, and the elasticity index k' can be represented as a quadratic function (k'(m)) of m. Herein, if Formula (3) is substituted into Formula (2), the following Formula (4) is obtained.

[Math. 4]

$$\frac{V^2}{x^2} = (am^2+bm+c)m \quad (4)$$

At the reference environment temperature, the filter controlling expression of deriving the voltage V from the peak transmission wavelength λ can be acquired by obtaining the coefficients a, b, and c of Formula (4) and the initial gap g having a relationship of m=g−x.

Figure 8:
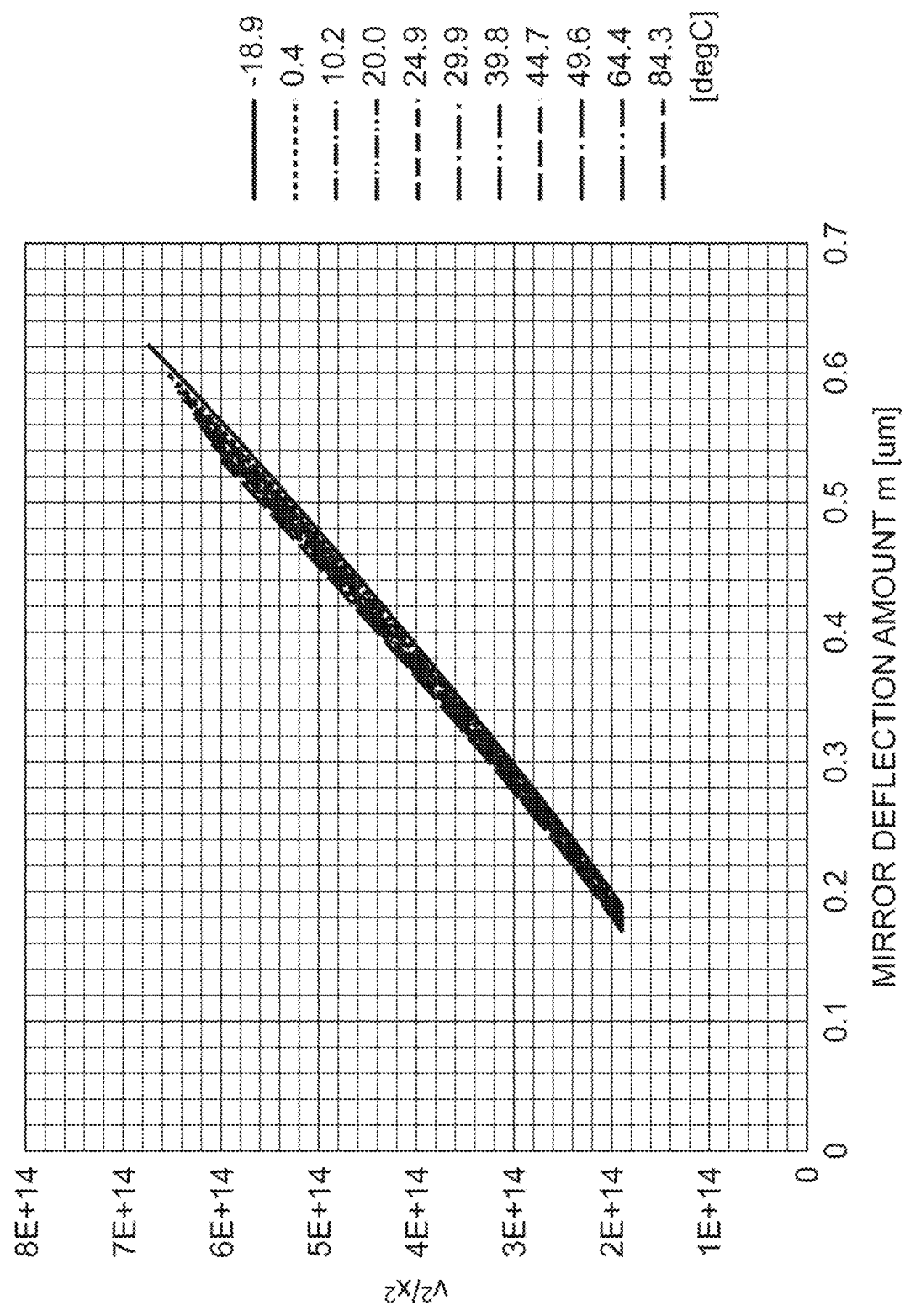
FIG. 8 is a graph in which a relationship between $V^2/x^2$ and a deflection amount is plotted for each temperature.
Figure 9:
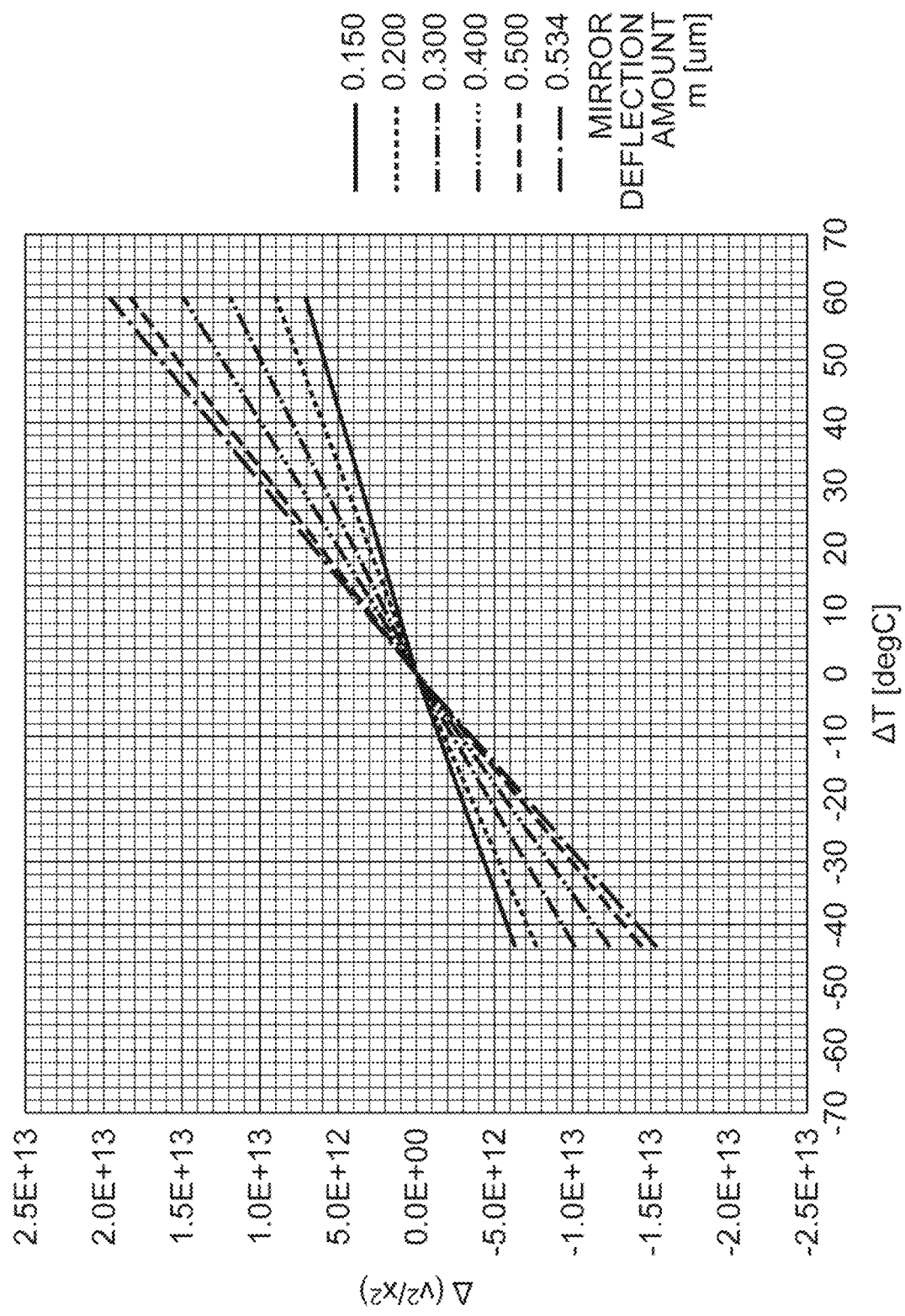
FIG. 9 is a graph in which, for each deflection amount in FIG. 8, each temperature change is plotted on the horizontal axis, and an amount of change in $V^2/x^2$ is plotted on the vertical axis.
Figure 10:
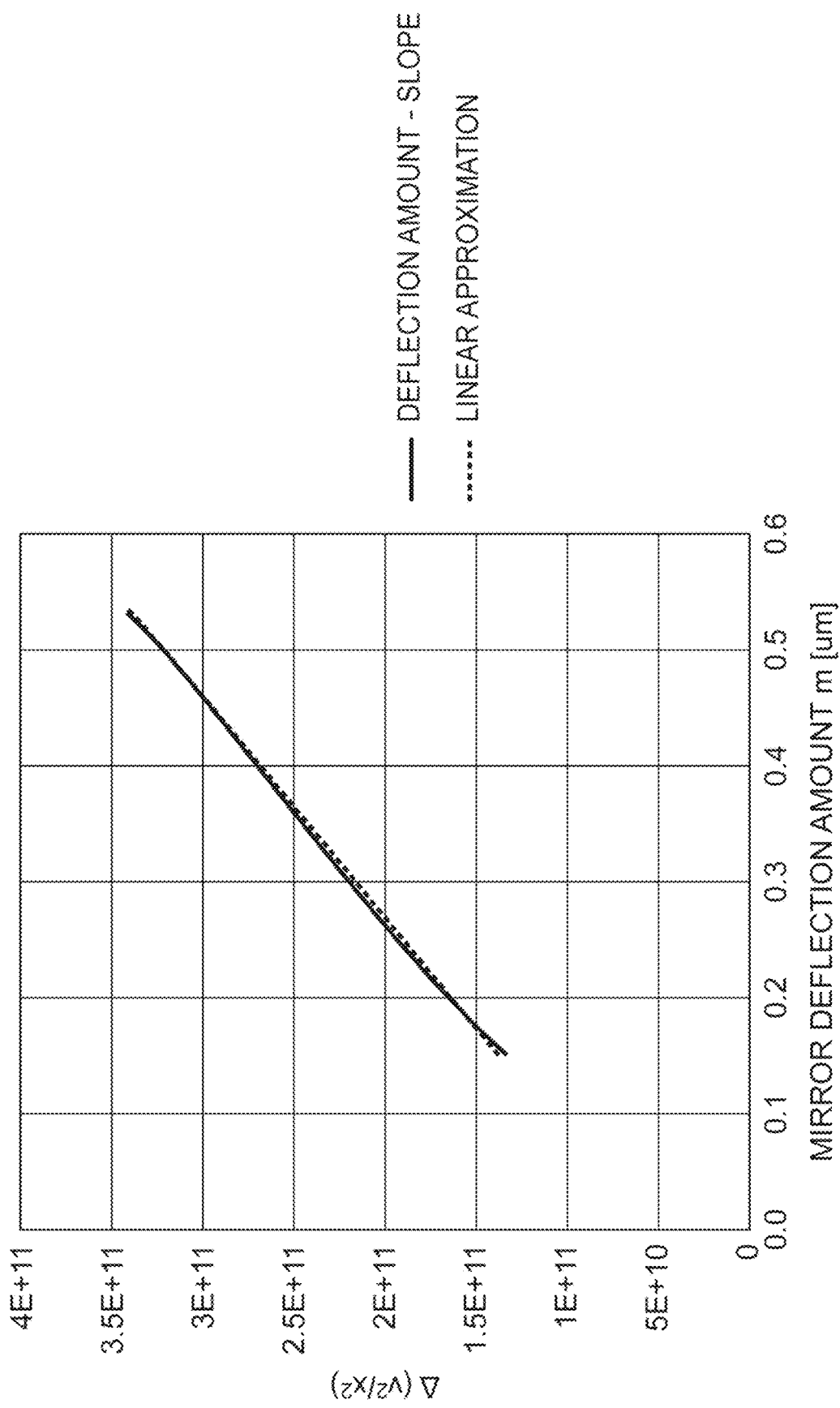
FIG. 10 is a graph showing a relationship between a slope and a deflection amount of a regression line of each graph in FIG. 9.

Subsequently, the first temperature correction term will be described. FIG. 8 is a graph in which the relationship between $V^2/x^2$ and the deflection amount m is plotted for each temperature on the basis of the actual measurement data of the light detection device. FIG. 9 is a graph in which, for each deflection amount m in FIG. 8, the reference temperature (25° C. in the illustrated example) is set to zero, each temperature change ΔT is plotted on the horizontal axis, and an amount $\Delta(V^2/x^2)$ of change in $V^2/x^2$ is plotted on the vertical axis. As shown in FIG. 9, with respect to each deflection amount m, the relationship between each temperature change ΔT and the amount $\Delta(V^2/x^2)$ of change in $V^2/x^2$ represents a relatively linear distribution. Herein, for each deflection amount m, the relationship between ΔT and $\Delta(V^2/x^2)$ is considered to be linear, and the slope of each regression line is determined. FIG. 10 is a graph showing a relationship between the slope $\Delta(V^2/x^2)$ of the regression line and a deflection amount m. As shown in FIG. 10, the relationship between $\Delta(V^2/x^2)$ and the deflection amount m can be approximated to be substantially linear and can be represented as a linear to cubic function of m depending on the required accuracy. That is, the following Formula (5) can be obtained as the expression representing the first temperature correction term. In Formula (5), d is a function of m and is any one of d=fm+g, d=fm²+gm+h, and d=fm³+gm²+hm+i. The coefficients f, g, h, and i are determined for each individual object.

[Math. 5]

$$\Delta\frac{V^2}{x^2} = d\Delta T \quad (5)$$

Figure 11:
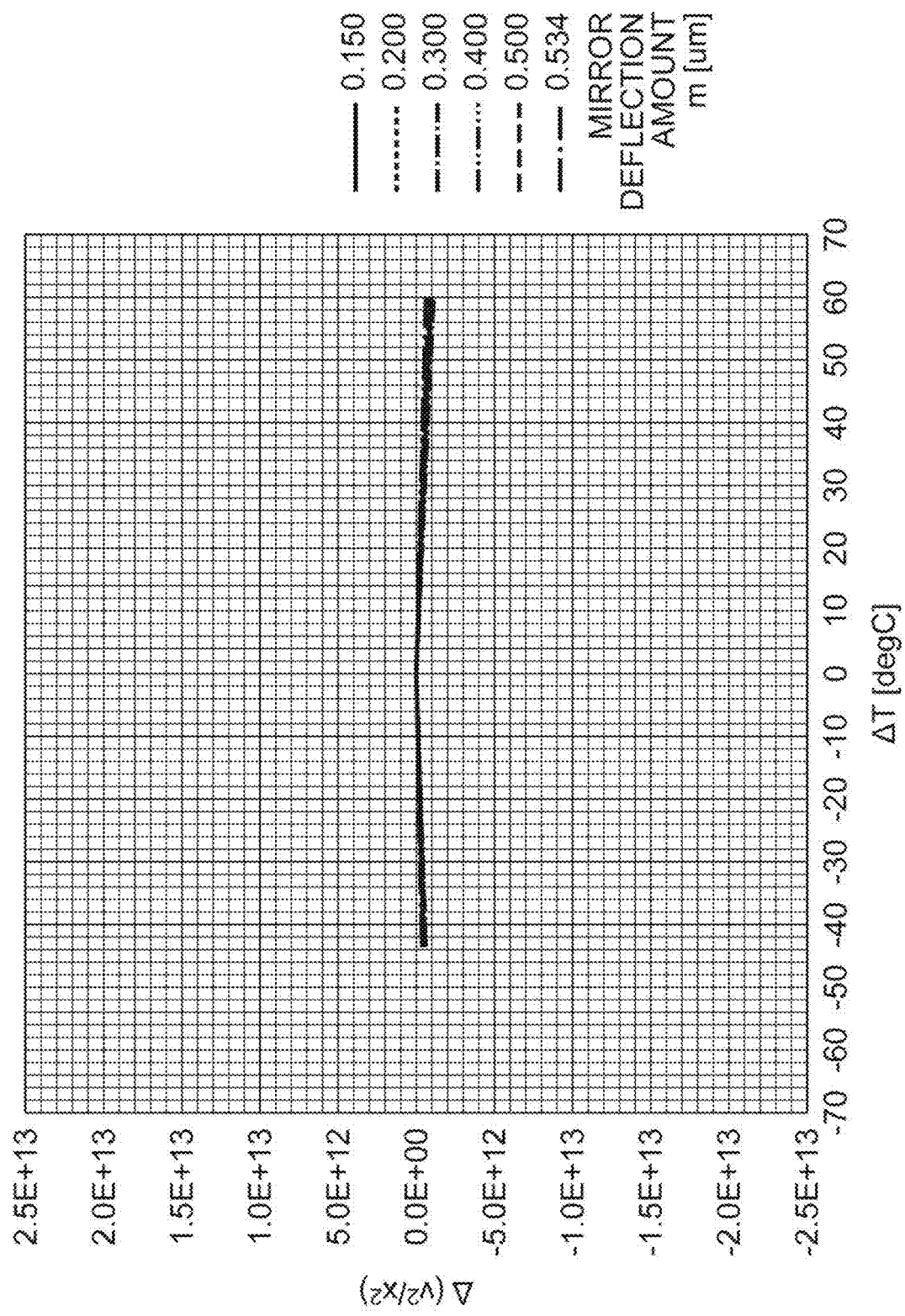
FIG. 11 is a graph showing a deviation from linear approximation in each graph of FIG. 9.

Subsequently, the second temperature correction term will be described. The relationship between ΔT and $\Delta(V^2/x^2)$ shown in FIG. 9 is actually a distribution that can be approximated by a quadratic polynomial, and as the absolute value of ΔT increases, $\Delta(V^2/x^2)$ deviates from the regression line. Therefore, more accurate temperature correction can be performed by using the second temperature correction term. FIG. 11 is a graph showing a relationship between a deviation $\Delta(V^2/x^2)$ from the regression line at $\Delta(V^2/x^2)$ and ΔT. As shown in FIG. 11, the relationship between the deviation $\Delta(V^2/x^2)$ and ΔT can be approximated by a quadratic function that substantially passes through the origin. That is, Formula (6) can be obtained as an expression representing the second temperature correction term. In Formula (6), e is a function of m.

[Math. 6]

$$\Delta\frac{V^2}{x^2} = e\Delta T^2 \quad (6)$$

Figure 12:
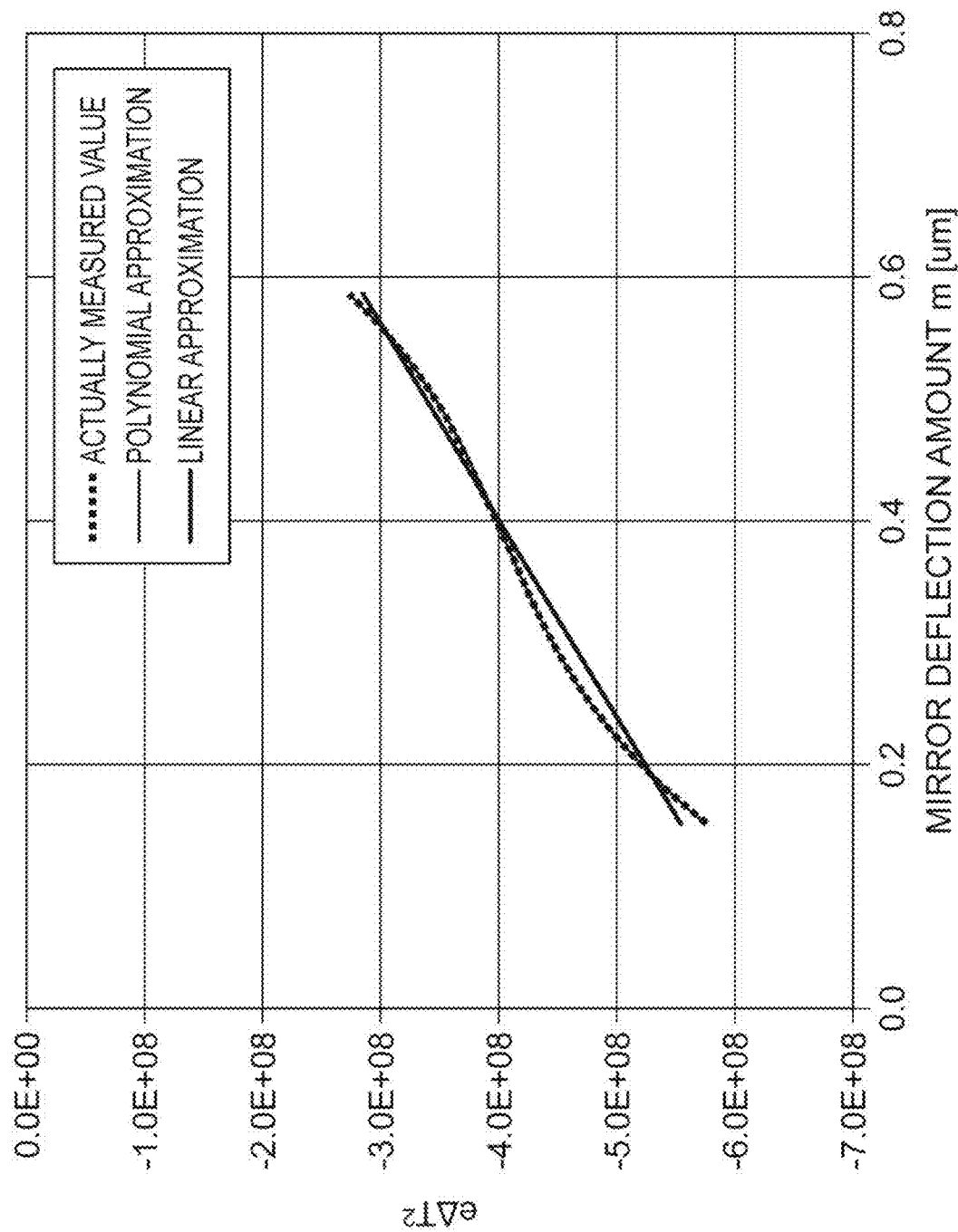
FIG. 12 is an example of a graph in which $e \times \Delta T^2$ is plotted on the vertical axis and a deflection amount is plotted on the horizontal axis.

However, the curve of the graph showing the relationship between the deviation $\Delta(V^2/x^2)$ and ΔT is different among the deflection amounts m. For this reason, in order to perform temperature correction more accurately, it is necessary to acquire and correct characteristics for each individual object. FIG. 12 is an example of a graph in which e×ΔT² is plotted on the vertical axis and a deflection amount m is plotted on the horizontal axis for a certain sample. As shown in FIG. 12, in this sample, e×ΔT² is represented by a cubic expression of m. In addition, as illustrated in the figure, e×ΔT² may be approximated as a linear expression of m. As described above, e in Formula (6) may be given as any one of e=jm+k, e=jm²+km+l, and e=jm³+km²+lm+n by using coefficients j, k, l, and n determined for each individual object according to the relationship between the difference $\Delta(V^2/x^2)$ and ΔT. In addition, e×ΔT² may be a fixed parameter.

From the above, the filter controlling expression in the present embodiment is represented by the following Formula (7).

[Math. 7]

$$\frac{V^2}{x^2} = (am^2 + bm + c)m + d\Delta T + e\Delta T^2 \qquad (7)$$

That is, the filter controlling expression is represented by a general expression represented in Formula (8).

[Math. 8]

$$\frac{V^2}{x^2} = k'(m) \cdot m + F(m, \Delta T) \qquad (8)$$

Figure 13:
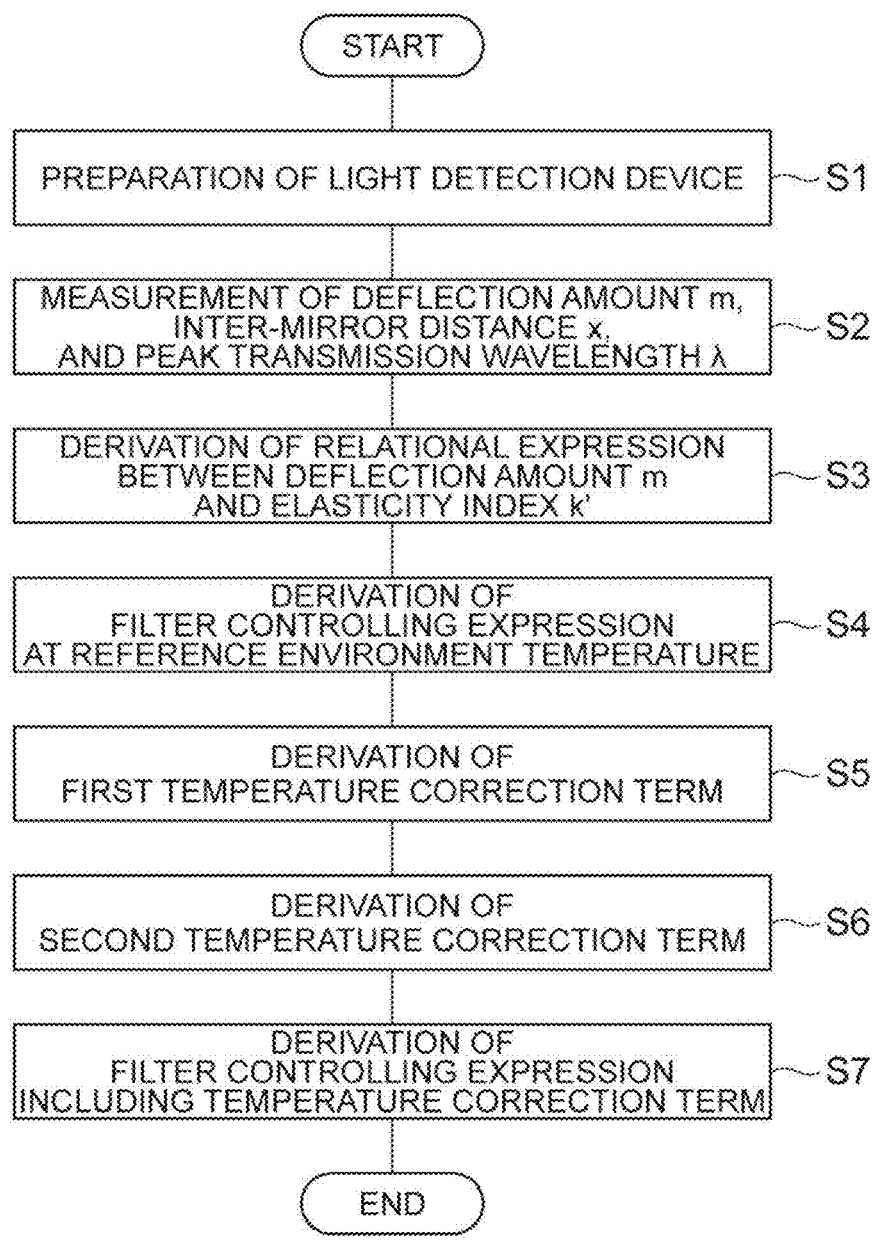
FIG. 13 is a flowchart illustrating a filter controlling expression derivation method.

Subsequently, steps of a filter controlling expression derivation method for deriving a filter controlling expression for the Fabry-Perot interference filter 10 in each light detection device will be described with reference to FIG. 13. First, the light detection device 1 including the Fabry-Perot interference filter 10 is prepared (step S1: preparation step). Next, for the prepared light detection device 1, by performing predetermined measurement under a predetermined environment temperature, a relational expression between the deflection amount of the movable mirror portion and the elasticity index of the movable mirror portion is derived. That is, for the Fabry-Perot interference filter 10 of the prepared light detection device 1, the deflection amount m, the inter-mirror distance x, and the peak transmission wavelength λ at the time of applying the voltage V are measured at a plurality of different voltages (step S2: first derivation step). More specifically, for example, at the reference environment temperature, the voltage is applied to the Fabry-Perot interference filter 10, and the peak transmission wavelength λ is measured. Subsequently, the inter-mirror distance x is derived from the peak transmission wavelength λ by referring to a linear expression representing the relationship between the inter-mirror distance x and the peak transmission wavelength λ obtained from simulation. Herein, the deflection amount m is a distance by which the second mirror portion 36 is moved from the initial position (the position of the second mirror portion 36 in the state where no voltage is applied) by the application of the voltage, and the deflection amount m satisfies a relationship of m=g−x. For this reason, the deflection amount m is determined on the basis of the inter-mirror distance x. In addition, the initial gap g can be obtained by measurement.

Subsequently, a relational expression between the deflection amount m and the elasticity index k' is derived (step S3: first derivation step). For example, as represented in Formula (3), in a case where the elasticity index k' is represented by a function configured with a quadratic polynomial, the relational expression between the deflection amount m and the elasticity index k' is derived by determining the coefficients a, b, and c of the polynomial. That is, the deflection amount m and the elasticity index k' in a state where the second mirror portion 36 is deflected by the deflection amount m are derived on the basis of the inter-mirror distance x and the deflection amount m derived as described above, the voltage V, and Formula (2). The deflection amount m and the elasticity index k' are derived at a plurality of different voltages, and thus, the coefficients a, b, and c of Formula (3) are derived. By substituting the derived Formula (3) into Formula (2), Formula (4) relating to the prepared Fabry-Perot interference filter 10 is derived (step S4: second derivation step). Accordingly, it is possible to obtain the filter controlling expression at the reference environment temperature.

Subsequently, the first temperature correction term and the second temperature correction term are derived (step S5, step S6: third derivation step). That is, for the prepared Fabry-Perot interference filter 10, the inter-mirror distance x, the deflection amount m, and the voltage V at each environment temperature are measured, and the above-mentioned Formulas (5) and (6) are derived. Accordingly, Formula (7) for the prepared Fabry-Perot interference filter 10 is derived (step S7: second derivation step). The voltage V can be derived from the peak transmission wavelength λ on the basis of Formula (7), the relationship between the inter-mirror distance x and the peak transmission wavelength λ, and the relationship of m=g−x.

In the light measurement system according to the present embodiment, Formula (7) derived on the basis of the actually measured values, the relationship between the inter-mirror distance x and the peak transmission wavelength λ, and the relationship of m=g−x are stored in the recording medium of the control device 70. The voltage derivation unit 71 of the control device 70 derives the voltage corresponding to the peak transmission wavelength λ on the basis of Formula (7), the relationship between the inter-mirror distance x and the peak transmission wavelength λ, and the relationship of m=g−x. Furthermore, the voltage setting unit 72 controls the voltage applied by the power supply device 60 on the basis of the voltage derived by the voltage derivation unit 71.

Figure 14:
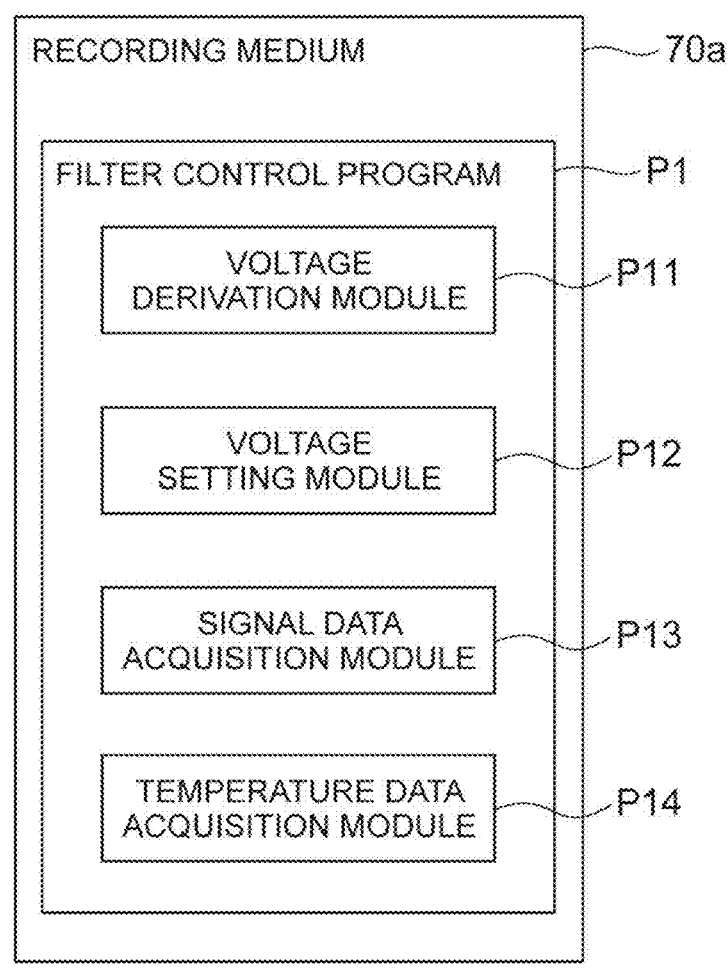
FIG. 14 is a diagram illustrating a filter control program.

FIG. 14 is a diagram illustrating a recording medium 70a in which a filter control program P1 for causing a computer to function as the control device 70 is stored. The filter control program P1 stored in the recording medium 70a includes a voltage derivation module P11, a voltage setting module P12, a signal data acquisition module P13, and a temperature data acquisition module P14. The functions realized by executing the voltage derivation module P11, the voltage setting module P12, the signal data acquisition module P13, and the temperature data acquisition module P14 are the same as the functions of the voltage derivation unit 71, the voltage setting unit 72, and the signal data acquisition unit 73, and the temperature data acquisition unit 74, respectively.

The filter control program P1 is recorded in a program recording area of the recording medium 70a. The recording medium 70a is configured as, for example, a recording medium such as a CD-ROM, a DVD, a ROM, or a semi-conductor memory. The filter control program P1 may be provided via a communication network as a computer data signal superimposed on a carrier wave.

In the Fabry-Perot interference filter 10 to which the filter controlling expression derivation method described above is applied, the mirror distance is controlled by the balance between the electrostatic force and the elastic force, and by controlling the inter-mirror distance, the transmission wavelength becomes variable. The electrostatic force is determined according to the voltage applied between the first mirror portion 35 and the second mirror portion 36, and the elastic force is determined according to the deflection amount and the elasticity index of the second mirror portion 36. In addition, the deflection amount is a distance obtained by subtracting the distance between the mirrors in the state where the voltage is applied from the distance between the mirrors in the state where the voltage is not applied. That is, the distance between the mirrors can be determined on the basis of the deflection amount. For this reason, the relational expression between the transmission wavelength of the light transmitted through the Fabry-Perot interference filter 10 and the voltage can be derived on the basis of the relational expression between the deflection amount and the elasticity index of the second mirror portion 36 and the relational expression between the electrostatic force and the elastic force.

In the case of deriving the relationship between the peak transmission wavelength and the voltage on the basis of the balance expression between the electrostatic force and the elastic force, it is necessary to rearrange Formula (1) as the expression of V and x. As represented in Formula (2), in principle, the elasticity index of the second mirror portion 36 is a constant. For this reason, Formula (1) can be converted into the relational expression between V and x by eliminating m which is a variable from the relational expression of Formula (1) by using the relationship of m=g−x. However, even if the relational expression between V and x is derived in this manner, actually measured values are not fitted well into the derived relational expression.

The inventors of the present invention have obtained FIG. 7 illustrating the relationship between the mirror deflection amount m and the elasticity index k' by analyzing the characteristics of about 2000 light detectors. Then, it is found from FIG. 7 that there is a certain regularity between the deflection amount m and the elasticity index k', and as represented in Formula (3), the elasticity index k' can be described as a function with the mirror deflection amount m as a variable. This is considered to be because the spring constant k changes with the deformation of the second stacked body 34 when the second mirror portion 36 operates according to the electrostatic force. Thus, by using Formula (3) representing the regularity, a general expression (that is, Formula (4)) representing the relationship between the peak transmission wavelength λ and the voltage V common to each Fabry-Perot interference filter was derived. On the basis of this general expression, a function describing the elasticity index in each Fabry-Perot interference filter can be easily obtained from the actual measurement of the deflection amount, the inter-mirror distance, and the transmission wavelength. For this reason, it is possible to easily acquire the relationship between the applied voltage and the transmission wavelength.

In addition, in the relational expression between the deflection amount and the elasticity index, the elasticity index may be described as a quadratic or higher-order polynomial using the deflection amount as a variable. According to this configuration, it is possible to easily derive the elasticity index with high accuracy.

In addition, in the case of deriving the relational expression between the transmission wavelength and the voltage, for the prepared Fabry-Perot interference filter 10, by measuring the deflection amount of the movable mirror portion at the time of applying the voltage while changing the environment temperature, a correction term having the deflection amount of the movable mirror portion and the change amount of the environment temperature as variables can be derived, and the relational expression between the transmission wavelength and the voltage can be derived so as to include the correction term. According to this configuration, it is possible to acquire the relationship between the transmission wavelength and the applied voltage according to the change in the environment temperature with high accuracy.

In addition, in the light measurement system 100, the voltage is controlled so as to correspond to the transmission wavelength on the basis of the relational expression between the electrostatic force and the elastic force. Herein, the electrostatic force is determined according to the voltage V applied to the first mirror portion 35 and the second mirror portion 36, and the elastic force is determined according to the deflection amount m of the second mirror portion 36 and the elasticity index k'. The elasticity index k' is described as a function of the deflection amount m of the second mirror portion 36 and varies according to the variation of the deflection amount m. For this reason, it is possible to control the peak transmission wavelength λ of the light with high accuracy.

Heretofore, although the embodiment of this disclosure is described in detail with reference to the drawings, a specific configuration is not limited to this embodiment.

For example, in the case of deriving the relational expression between the transmission wavelength and the voltage, the relational expression between the transmission wavelength and the voltage may be derived so as to include the first temperature correction term and the second temperature correction term obtained for other Fabry-Perot interference filters corresponding to the prepared Fabry-Perot interference filter. Herein, "the other Fabry-Perot interference filters corresponding to the prepared Fabry-Perot interference filter" denote Fabry-Perot interference filters which have the same structure in design and from which similar operations can be expected such as, for example, Fabry-Perot interference filters having the same type or Fabry-Perot interference filters manufactured in the same lot with respect to the prepared Fabry-Perot interference filters. According to this configuration, it is not necessary to derive the correction term in all the individual objects, and it is possible to easily acquire the relationship between the transmission wavelength and the applied voltage according to the change of the environment temperature.

In addition, although the example has been illustrated in which the elasticity index k' is represented by a quadratic polynomial having a deflection amount m as a variable, the present invention is not limited thereto. Depending on the shape of the graph of FIG. 7, the elasticity index k' may be approximated as a quadratic or higher order polynomial such as a cubic polynomial, as illustrated in the following Formula (9). In Formula (9), n is a natural number of 2 or more, and $a_n$ to $a_0$ are coefficients.

[Math. 9]

$$k' = a_n m^n + a_{n-1} m^{n-1} + \ldots + a_1 m + a_0 \quad (9)$$

In addition, although an example is illustrated in which the inter-mirror distance x and the peak transmission wavelength λ are converted on the basis of a linear expression representing the relationship between the inter-mirror distance x and the peak transmission wavelength λ, the present invention is not limited thereto. Between actual individual objects, variations occur in the relationship between the inter-mirror distance x and the peak transmission wavelength λ. That is, the slope and the intercept in the linear expression representing the relationship between the inter-mirror distance x and the peak transmission wavelength λ are changed between the individual objects. However, in principle, the linearity of the relationship is maintained. For this reason, the variation between the individual objects is absorbed by the coefficients (described later) of the filter controlling expression obtained by the actual measurement of the individual objects. For this reason, the filter controlling expression obtained only from the actual measurement can be obtained as an effective expression even if x=λ.

In addition, although the example has been illustrated in which the initial gap g in each Fabry-Perot interference filter 10 is derived from the actually measured value, the initial gap g may be derived by simulation.

In addition, although the method (method for deriving the relational expression between the deflection amount in and the elasticity index k') in which the product of the coefficient C and the spring constant k is set as the elasticity index k' and the elasticity index k' is specified as a function of the deflection amount m has been illustrated, the present invention is not limited thereto. For example, in Formula (2), the elastic coefficient k may be specified as an elasticity index, and the elastic coefficient k may be specified as a function of the deflection amount m (that is, as a value that changes according to the deflection amount m).

Moreover, although the example where the reference environment temperature (predetermined environment temperature) is assumed to be a room temperature of 25° C. is illustrated, the present invention is not limited thereto. The reference environment temperature may be arbitrarily determined in accordance with the environment temperature at which the Fabry-Perot interference filter 10 is actually used. In this case, it is possible to acquire the relationship between the transmission wavelength and the applied voltage according to the actual use environment with higher accuracy.

EXAMPLE

Figure 15:
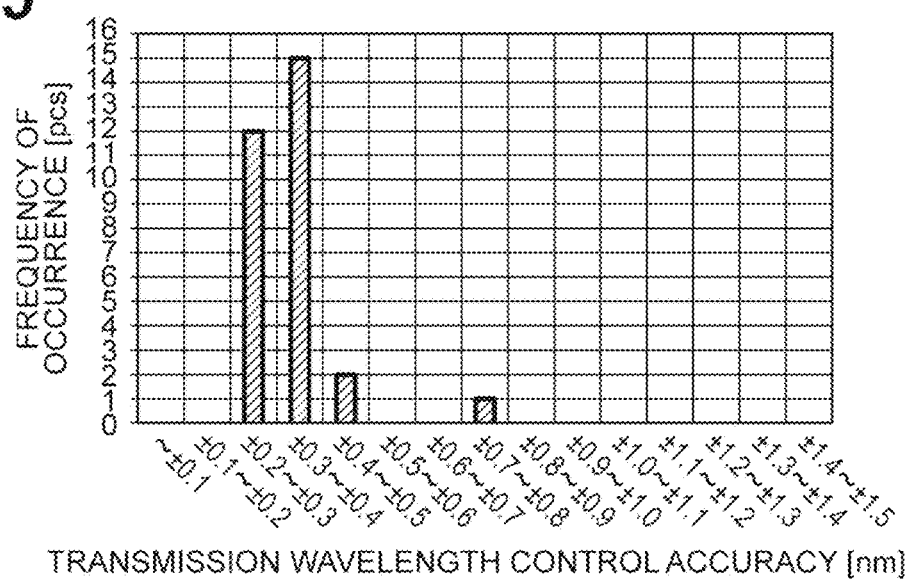
FIG. 15 is a diagram illustrating results of Example.
Figure 15:
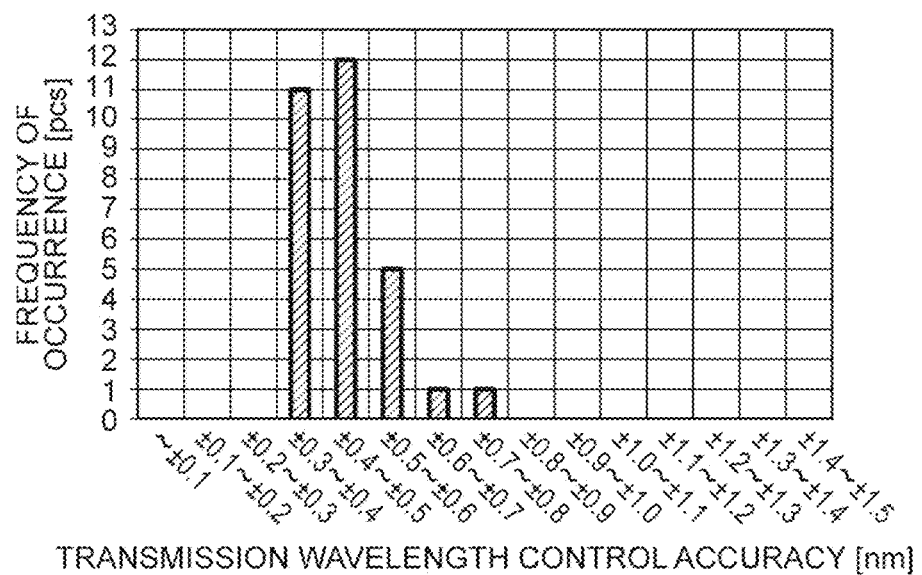
Figure 15:
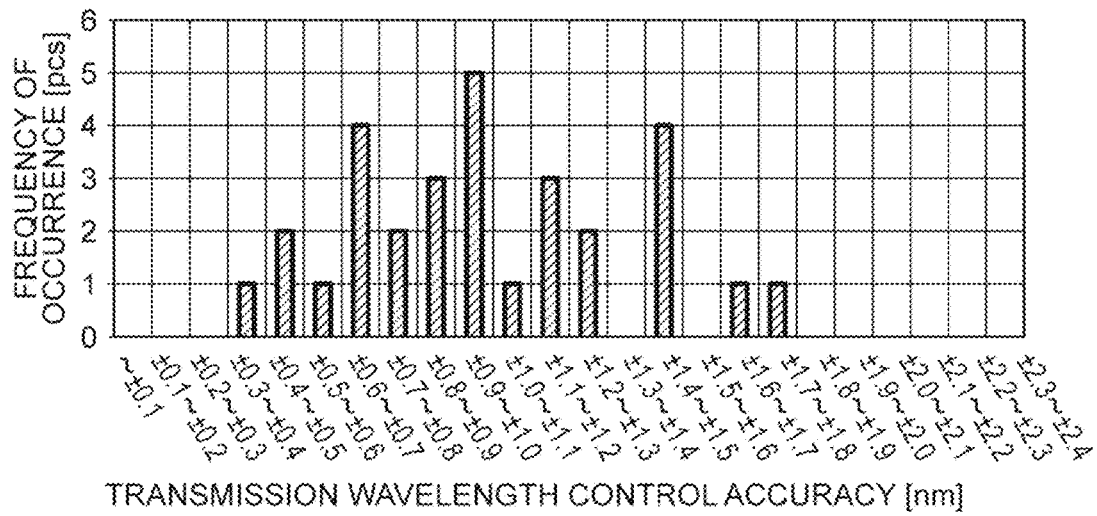

The accuracy of the derived filter controlling expression was evaluated for the light detection device manufactured according to the above-described embodiment. In the present embodiment, 30 samples were prepared. In this example, evaluation was performed for each sample on the basis of the difference between the peak transmission wavelength obtained from the filter controlling expression and the peak transmission wavelength obtained by actual measurement. The maximum value of the difference at the time when the environment temperature and voltage were varied was evaluated as transmission wavelength control accuracy. FIG. 15(a) illustrates the result in which both d and e are approximated as a cubic expression in Formula (7). FIG. 15(b) illustrates the result in which both d and e are approximated as a linear expression in Formula (7). FIG. 15(c) illustrates the result in a case where both d and e are linear expressions in Formula (7) and each coefficient is an average value of 30 samples. In FIGS. 15(a) to 15(c), the number of samples for each transmission wavelength control accuracy is summarized. That is, the larger the number of samples having a small value of the transmission wavelength control accuracy, the higher the accuracy. As illustrated in FIG. 15(a), it can be confirmed that, in a case where both d and e are approximated as a cubic expression, there are many samples having a transmission wavelength control accuracy value of 0.4 nm or less, and the wavelength control is performed with high accuracy. As illustrated in FIG. 15(b), it can be confirmed that, in a case where both d and e are approximated as a linear expression, the value of the transmission wavelength control accuracy becomes larger by about 0.1 nm in comparison to the approximation of a cubic expression, but the wavelength control is performed with sufficiently high accuracy. As illustrated in FIG. 15(c), it can be confirmed that, in a case where d and e are approximated as an average of linear expression, some variation is seen in the value of the transmission wavelength control accuracy, but the light detection device is sufficiently useful according to the required measurement accuracy.

REFERENCE SIGNS LIST

1: light detection device, 10: Fabry-Perot interference filter, 35: first mirror portion (fixed mirror portion), 36: second mirror portion (movable mirror portion), 70: control device, 100: light measurement system.

The invention claimed is:

1. A filter controlling expression derivation method comprising:

preparing a Fabry-Perot interference filter of which distance between a fixed mirror and a movable mirror is controlled by balancing an electrostatic force generated between the fixed mirror and the movable mirror and an elastic force generated in the movable mirror at a time of applying a voltage;

deriving a relational expression between a deflection amount of the movable mirror and an elasticity index of the movable mirror in which the elasticity index of the movable mirror is described as a quadratic or higher-order polynomial with the deflection amount of the movable mirror as a variable by performing predetermined measurement on the prepared Fabry-Perot interference filter under a predetermined environment temperature; and deriving a relational expression between a transmission wavelength of light transmitted through the Fabry-Perot interference filter and the voltage as a filter controlling expression based on the relational expression between the deflection amount and the elasticity index and a relational expression between the electrostatic force and the elastic force, wherein, in the deriving the relational expression between the deflection amount and the elasticity index, as the predetermined measurement, the transmission wavelength of light transmitted through the Fabry-Perot interference filter is measured in a state where each of a plurality of different voltages is applied as the voltage.

2. The filter controlling expression derivation method according to claim 1, further comprising deriving a correction term with the deflection amount and a change amount of environment temperature as variables by performing the predetermined measurement on another Fabry-Perot interference filter corresponding to the prepared Fabry-Perot interference filter under each of a plurality of environment temperatures including the predetermined environment temperature and being different from each other, wherein, in the deriving the relational expression between the transmission wavelength and the voltage, the relational expression between the transmission wavelength and the voltage is derived as the filter controlling expression so as to include the correction term.

3. The filter controlling expression derivation method according to claim 1, wherein, in the deriving the relational expression between the deflection amount and the elasticity index, a correction term with the deflection amount and a change amount of environment temperature as variables are derived by performing the predetermined measurement on the prepared Fabry-Perot interference filter under each of a plurality of environment temperatures including the predetermined environment temperature and being different from each other, and wherein, in the deriving the relational expression between the transmission wavelength and the voltage, the relational expression between the transmission wavelength and the voltage is derived as the filter controlling expression so as to include the correction term.

4. A light measurement system comprising:
- a Fabry-Perot interference filter of which distance between a fixed mirror and a movable mirror is controlled by balancing an electrostatic force generated between the fixed mirror and the movable mirror and an elastic force generated in the movable mirror at a time of applying a voltage; and
- a control device which controls the voltage based on a relational expression between the electrostatic force and the elastic force including an elasticity index of the movable mirror described as a quadratic or higher-order polynomial with a deflection amount of the movable mirror as a variable.

5. A control method for a Fabry-Perot interference filter being a control method for controlling a voltage in a Fabry-Perot interference filter of which distance between a fixed mirror and a movable mirror is controlled by balancing an electrostatic force generated between the fixed mirror and the movable mirror and an elastic force generated in the movable mirror at a time of applying the voltage, the control method comprising:
- deriving a voltage corresponding to a transmission wavelength of light transmitted through the Fabry-Perot interference filter based on a relational expression between the electrostatic force and the elastic force including an elasticity index of the movable mirror described as a quadratic or higher-order polynomial with a deflection amount of the movable mirror as a variable; and
- setting the derived voltage as the voltage to be applied.

6. A non-transitory computer-readable recording medium recording a filter control program for causing a computer to execute a process of controlling a voltage in a Fabry-Perot interference filter of which distance between a fixed mirror and a movable mirror is controlled by balancing an electrostatic force generated between the fixed mirror and the movable mirror and an elastic force generated in the movable mirror at a time of applying the voltage, the filter control program causing the computer to function as:
- a voltage derivation unit which derives a voltage corresponding to a transmission wavelength of light transmitted through the Fabry-Perot interference filter based on a relational expression between the electrostatic force and the elastic force including an elasticity index of the movable mirror described as a quadratic or higher-order polynomial with a deflection amount of the movable mirror as a variable; and
- a voltage setting unit which sets the derived voltage as the voltage to be applied.

\* \* \* \* \*